United States Patent
Zhang et al.

(10) Patent No.: US 12,124,175 B2
(45) Date of Patent: Oct. 22, 2024

(54) COMPENSATION METHOD FOR OVERLAY DEVIATION

(71) Applicant: Semiconductor Manufacturing South China Corporation, Shanghai (CN)

(72) Inventors: Hai Zhang, Shanghai (CN); Xiaosong Yang, Shanghai (CN); Yimin Wu, Shanghai (CN)

(73) Assignee: Semiconductor Manufacturing South China Corporation, Shanghai (CN)

( * ) Notice: Subject to any disclaimer, the term of this patent is extended or adjusted under 35 U.S.C. 154(b) by 394 days.

(21) Appl. No.: 17/445,775

(22) Filed: Aug. 24, 2021

(65) Prior Publication Data
US 2022/0066329 A1    Mar. 3, 2022

(30) Foreign Application Priority Data
Aug. 31, 2020    (CN) .......................... 202010898429.2

(51) Int. Cl.
| | | |
|---|---|---|
| *G03F 7/00* | (2006.01) | |
| *G01N 21/95* | (2006.01) | |
| *H01L 21/66* | (2006.01) | |

(52) U.S. Cl.
CPC ..... *G03F 7/70633* (2013.01); *G01N 21/9501* (2013.01); *H01L 22/12* (2013.01); *H01L 22/20* (2013.01)

(58) Field of Classification Search
CPC .......... G01N 21/9501; G01N 21/9503; G01N 21/9505; G03F 7/70633
See application file for complete search history.

(56) References Cited

U.S. PATENT DOCUMENTS

2016/0351455 A1*  12/2016  Jung ....................... H01L 22/12

FOREIGN PATENT DOCUMENTS

CN            112015056 A  *  12/2020  ......... G03F 7/70516

* cited by examiner

*Primary Examiner* — Edward Chin
(74) *Attorney, Agent, or Firm* — Anova Law Group, PLLC

(57) ABSTRACT

A compensation method for overlay deviation, including: obtaining x first inspection distribution maps; and performing a first iteration on wafers of an n-th lot according to the x first inspection distribution maps to obtain an n-th high-order overlay deviation model, that the wafers of the n-th lot include a plurality of n-th wafers, n is a natural number greater than or equal to one, and performing the first iteration includes: obtaining x n-th wafers to be inspected from the wafers of the n-th lot; allocating the x first inspection distribution maps, that each n-th wafer to be inspected corresponds to one first inspection distribution map; obtaining an n-th overlay accuracy information of each n-th wafer to be inspected according to a corresponding first inspection distribution map; and obtaining the n-th high-order overlay deviation model according to the x n-th overlay accuracy information.

20 Claims, 12 Drawing Sheets

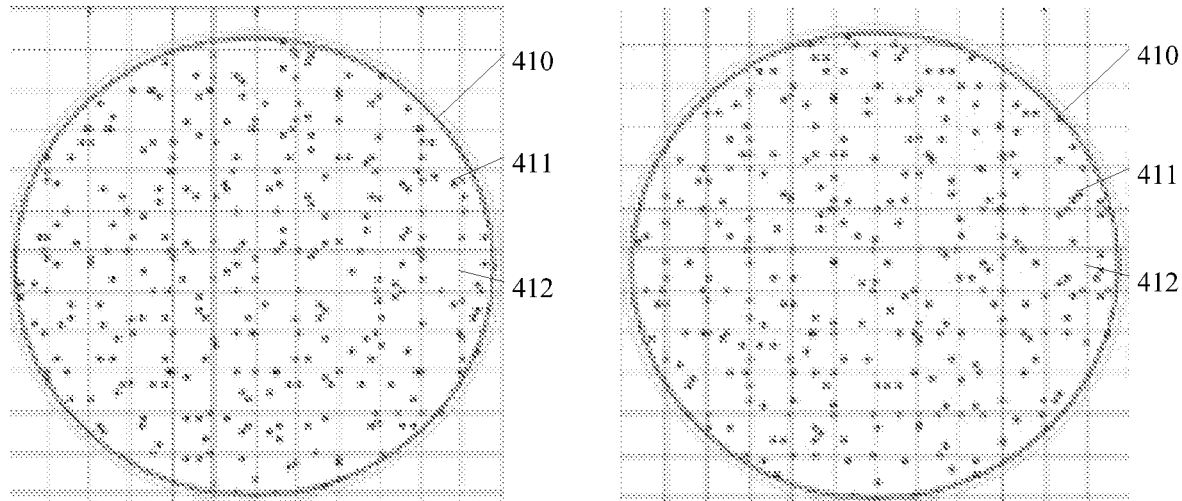

FIG. 15

| Obtain x first inspection distribution maps, each first inspection distribution map includes a plurality of inspection sites, each inspection site at least includes one inspection position, inspection positions in the x first inspection distribution maps are not repeated with each other, and x is a natural number greater than or equal to 2 | ⟋ S500 |

↓

| Perform a first iteration on wafers of an n-th lot according to the x first inspection distribution maps to obtain an n-th high-order overlay deviation model, that the wafers of the n-th lot include p groups of wafers, and each group of the p groups of wafers includes a plurality of n-th wafers, where n is a natural number greater than or equal to 1, and p is a natural number greater than or equal to 2 | ⟋ S510 |

↓

| Obtain wafers of an (n+1)-th lot, and perform the first iteration on the wafers of the (n+1)-th lot according to the x first inspection distribution maps, to obtain an (n+1)-th high-order overlay deviation model, that the wafers of the (n+1)-th lot include t groups of wafers, where t is a natural number greater than or equal to 2, and each group of the t groups of wafers includes a plurality of (n+1)-th wafers | ⟋ S520 |

FIG. 16

COMPENSATION METHOD FOR OVERLAY DEVIATION

CROSS-REFERENCE TO RELATED APPLICATION

This application claims the priority of Chinese Patent Application No. 202010898429.2, filed on Aug. 31, 2020, the content of which is incorporated herein by reference in its entirety.

TECHNICAL FIELD

The present disclosure generally relates to the field of semiconductor manufacturing and, more particularly, to a compensation method for overlay deviation.

BACKGROUND

Overlay (OVL) accuracy refers to overlapping position accuracy of a current layer pattern and a previous layer pattern in a photolithography manufacturing process. Since an integrated circuit chip is manufactured by overlapping multiple circuit layers, if a current layer and a previous layer are not aligned, the chip will not work properly. Therefore, in a process of forming the current layer, it is extremely important to reduce overlay deviation and ensure that the overlay deviation is within a deviation range.

In existing technologies, an overlay deviation compensation process is usually performed several times to continuously improve the overlay accuracy of wafers of a current lot. The overlay deviation compensation process includes: obtaining wafers to be inspected from wafers of a previous lot; performing overlay accuracy inspections on the wafers to be inspected, to obtain overlay accuracy information of the previous lot, obtaining an overlay deviation model according to the overlay accuracy information of the previous lot; and performing an overlay deviation compensation on the wafers of the current lot according to the overlay deviation model.

However, in the above method, the overlay accuracy of the wafers of the current lot is still poor, and efficiency of the overlay deviation compensation is low.

SUMMARY

One aspect of the present disclosure provides a compensation method for overlay deviation, including: obtaining x first inspection distribution maps, that each first inspection distribution map includes a plurality of inspection sites, each inspection site at least includes one inspection position, inspection positions in the x first inspection distribution maps are not repeated with each other, and x is a natural number greater than or equal to two; and performing a first iteration on wafers of an n-th lot according to the x first inspection distribution maps to obtain an n-th high-order overlay deviation model, that the wafers of the n-th lot include a plurality of n-th wafers, n is a natural number greater than or equal to one, and performing the first iteration includes: obtaining x n-th wafers to be inspected from the wafers of the n-th lot; allocating the x first inspection distribution maps, that each n-th wafer to be inspected corresponds to one first inspection distribution map; obtaining an n-th overlay accuracy information of each n-th wafer to be inspected according to a corresponding first inspection distribution map; and obtaining the n-th high-order overlay deviation model according to the x n-th overlay accuracy information.

Optionally, the method further includes: providing wafers of an (n+1)-th lot, and according to at least a portion of from a first high-order overlay deviation model through the n-th high-order overlay deviation model obtained from historical processing, performing an overlay deviation compensation on the wafers of the (n+1)-th lot.

Optionally, the wafers of the (n+1)-th lot include a plurality of (n+1)-th wafers; and the method further includes: after performing the overlay deviation compensation on the wafers of the (n+1)-th lot, performing the first iteration on the wafers of the (n+1)-th lot according to the x first inspection distribution maps to obtain an (n+1)-th high-order overlay deviation model.

Optionally, the wafers of the (n+1)-th lot include a plurality of (n+1)-th wafers; and the method further includes: obtaining y second inspection distribution maps, that each second inspection distribution map includes a plurality of inspection sites, each inspection site at least includes one inspection position, inspection positions in the y second inspection distribution maps are not repeated with each other, and y is a natural number greater than or equal to 2; and after performing the overlay deviation compensation on the wafers of the (n+1)-th lot, performing the first iteration on the wafers of the (n+1)-th lot according to the y second inspection distribution maps to obtain the (n+1)-th high-order overlay deviation model.

Optionally, the wafers of the n-th lot includes p groups of wafers, where p is a natural number greater than or equal to 2, and each group of the p groups of wafers includes a plurality of n-th wafers. Obtaining the x n-th wafers to be inspected from the wafers of the n-th lot includes: obtaining two or more n-th wafers to be inspected from the plurality of n-th wafers of each group.

Optionally, obtaining the wafers of the n-th lot includes: obtaining an i-th group high-order overlay deviation model of an i-th group, where i is any natural number from 1 to p−1; and according to at least a portion of from a first group high-order overlay deviation model through the i-th group high-order overlay deviation model, performing the overlay deviation compensation on an (i+1)-th group.

Optionally, obtaining the wafers of the n-th lot further includes: when n is greater than 1, further according to at least a portion of from the first high-order overlay deviation model through an (n−1)-th high-order overlay deviation model obtained from historical processing, performing the overlay deviation compensation on the (i+1)-th group.

Optionally, obtaining the i-th group high-order overlay deviation model includes: fitting two or more n-th overlay accuracy information of the i-th group to obtain the i-th group of high-order overlay deviation model.

Optionally, the method further includes: obtaining the wafers of the (n+1)-th lot, and performing the first iteration on the wafers of the (n+1)-th lot according to the x first inspection distribution maps, to obtain the (n+1)-th high-order overlay deviation model.

Optionally, the wafers of the (n+1)-th lot includes t groups of wafers, t is a natural number greater than or equal to 2, and each group of the t groups of wafers includes a plurality of (n+1)-th wafers. Obtaining x (n+1)-th wafers to be inspected from the wafers of the (n+1)-th lot includes: obtaining two or more (n+1)-th wafers to be inspected from the plurality of (n+1)-th wafers of each group.

Optionally, obtaining the wafers of the (n+1)-th lot includes: according to at least a portion of from the first high-order overlay deviation model through the n-th high-order overlay deviation model obtained from historical processing, performing the overlay deviation compensation on a first group of the t groups of wafers.

Optionally, obtaining the wafers of the (n+1)-th lot further includes: obtaining a k-th group high-order overlay deviation model of a k-th group, where k is any natural number from 2 to t−1; and according to at least a portion of from a first group high-order overlay deviation model through the k-th group high-order overlay deviation model, performing the overlay deviation compensation on a (k+1)-th group.

Optionally, obtaining the wafers of the (n+1)-th lot further includes: after obtaining the k-th group high-order overlay deviation model of the k-th group, further according to at least a portion of from the first high-order overlay deviation model through the n-th high-order overlay deviation model obtained from historical processing, performing the overlay deviation compensation on the (k+1)-th group.

Optionally, obtaining the k-th group high-order overlay deviation model of the k-th group includes: fitting two or more (n+1)-th overlay accuracy information of the k-th group to obtain the k-th group high-order overlay deviation model.

Optionally, obtaining the x n-th wafers to be inspected from the wafers of the n-th lot further includes: obtaining a same number of n-th wafers to be inspected from the plurality of n-th wafers of each group.

Optionally, obtaining the n-th high-order overlay deviation model according to the x n-th overlay accuracy information includes: fitting the x n-th overlay accuracy information to obtain the n-th high-order overlay deviation model.

Optionally, obtaining the x first inspection distribution maps further includes: providing an edge-to-center ratio factor; and according to the edge-to-center ratio factor, obtaining the x first inspection distribution maps, that a distribution of the plurality of inspection positions of each first inspection distribution map on the entire first inspection distribution map conforms to the edge-to-center ratio factor.

Optionally, obtaining the y second inspection distribution maps further includes: providing an edge-to-center ratio factor; and according to the edge-to-center ratio factor, obtaining the y second inspection distribution maps, that a distribution of the plurality of inspection positions of each second inspection distribution map on the entire second inspection distribution map conforms to the edge-to-center ratio factor.

Optionally, obtaining the x first inspection distribution maps further includes: providing an inspection position information database, that the inspection position information database includes a plurality of inspection positions that are not repeated with each other; and obtaining the inspection positions of each first inspection distribution map from the inspected location information database.

Optionally, a sum of numbers of the inspection positions of the x first inspection distribution maps is a same as a total number of the inspection positions in the inspection position information database.

Optionally, obtaining the y second inspection distribution maps further includes: providing an inspection position information database, that the inspection position information database includes a plurality of inspection positions that are not repeated with each other; and obtaining the inspection positions of each second inspection distribution map from the inspection position information database.

Optionally, in the x first inspection distribution maps, a difference between numbers of the inspection positions in different first inspection distribution maps is within 15.

Optionally, a number of the inspection positions in each first inspection distribution map is less than or equal to 600.

Compared with existing technologies, the technical solution of the present disclosure has the following beneficial effects.

In the compensation method for overlay deviation provided by the technical solution of the present disclosure, since the first iteration is performed on the wafers of the n-th lot according to the x first inspection distribution maps in which the inspection positions are not repeated with each other, it is possible to obtain the n-th high-order overlay deviation model with better accuracy and higher order; and at a same time, efficiency of the first iteration is higher, thereby improving the overlay accuracy of semiconductor structures, and improving the efficiency of the overlay deviation compensation.

Further, the y second inspection distribution maps are obtained, and the first iteration is performed on the wafers of the (n+1)-th lot according to the y second inspection distribution maps, to obtain the (n+1)-th high-order overlay deviation model, that is, for the wafers to be inspected of wafers of each lot, the inspection overlay accuracy information is obtained again according to the second inspection distribution maps. Therefore, randomness of the positions to inspect the overlay accuracy of the wafers to be inspected of each lot is increased, so that the greater a number of iterations of the first iteration, the more accurate the (n+1)-th high-order overlay deviation model, thereby improving the accuracy of the subsequent overlay deviation compensation.

Further, the wafers of the n-th lot includes the p groups of wafers, p is a natural number greater than or equal to 2, each group of the p groups of wafers includes a plurality of n-th wafers, and the method for obtaining the x n-th wafers to be inspected from a plurality of n-th wafers includes: obtaining two or more n-th wafers to be inspected from the plurality of n-th wafers of each group. Therefore, on a basis of inspecting all x first inspection distribution maps, inspection time of each group of wafers can be further reduced, and the efficiency of the overlay deviation compensation can be better improved.

Further, the edge-to-center ratio factor refers to a ratio between the number of the inspection positions distributed in the inspection sites corresponding to shots close to a center of a wafer and the number of the inspection positions distributed in the inspection sites corresponding to shots close to an edge of the wafer. The x first inspection distribution maps are obtained according to the edge-to-center ratio factor, and the distribution of the plurality of inspection positions of each first inspection distribution map on the entire first inspection distribution map conforms to the edge-to-center ratio factor. Therefore, in different current layers, it is possible to increase the inspection positions of the inspection sites corresponding to areas that are prone to defects, etc., which reduce the overlay accuracy, so that in a process of obtaining the n-th high-order overlay deviation model, it is possible to increase a number of inspection positions for actual inspections of the overlay accuracy for the areas that are prone to defects, and add more reference samples for ranges of the overlay accuracy that may have sudden changes, so as to further improve the accuracy of the n-th high-order overlay deviation model.

Further, the plurality of inspection positions that are not repeated with each other in the inspection position information database refer to all the inspection positions that can be used to perform the overlay accuracy inspection. Since the sum of the numbers of the inspection positions of the x first inspection distribution maps is the same as the total number of the inspection positions in the inspection position information database, by inspecting the x n-th wafers to be inspected according to the x first inspection distribution maps, actual measurement of the overlay accuracy is performed at least once on the positions of the n-th wafer to be inspected corresponding to all inspectable inspection positions, thereby further improving the accuracy of the n-th high-order overlay deviation model.

BRIEF DESCRIPTION OF THE DRAWINGS

The following accompanying drawings are merely examples for illustrative purposes according to various disclosed embodiments and are not intended to limit the scope of the present disclosure.

FIG. 15 is a schematic diagram of second inspection distribution maps according to various embodiments of the present disclosure;

FIG. 16 is a schematic flowchart of a compensation method for overlay deviation according to various embodiments of the present disclosure.

DETAILED DESCRIPTION

In existing technologies, overlay accuracy of wafers of a current lot is poor, and efficiency of an overlay deviation compensation is low, which will be described in detail below with reference to the accompanying drawings.

In an existing compensation method for overlay deviation of wafers, a process of the compensation method for overlay deviation includes: S100, S110, S120, and S130.

In S100, a full inspection distribution map (dense map) is provided.

In S110, an inspection distribution map is formed according to the dense map.

In S120, an overlay deviation model of wafers of a previous lot is obtained according to the inspection distribution map.

In S130, a compensation is performed on wafers of a current lot according to an overlay deviation model of wafers of a first lot through the overlay deviation model of the wafers of the previous lot obtained from historical processing.

A process of obtaining the overlay deviation model of the wafers of the previous lot according to the inspection distribution map includes: S121, S122, S123, and S124.

In S121, the wafers of the previous lot are provided. The wafers of the previous lot include a plurality of first wafers.

In S122, at least one first wafer of the plurality of first wafers is used as wafers to be inspected.

In S123, overlay accuracy information of each wafer to be inspected is obtained according to the inspection distribution map.

In S124, the overlay deviation model of the wafers of the previous lot is obtained according to the overlay accuracy information.

Figure 1:
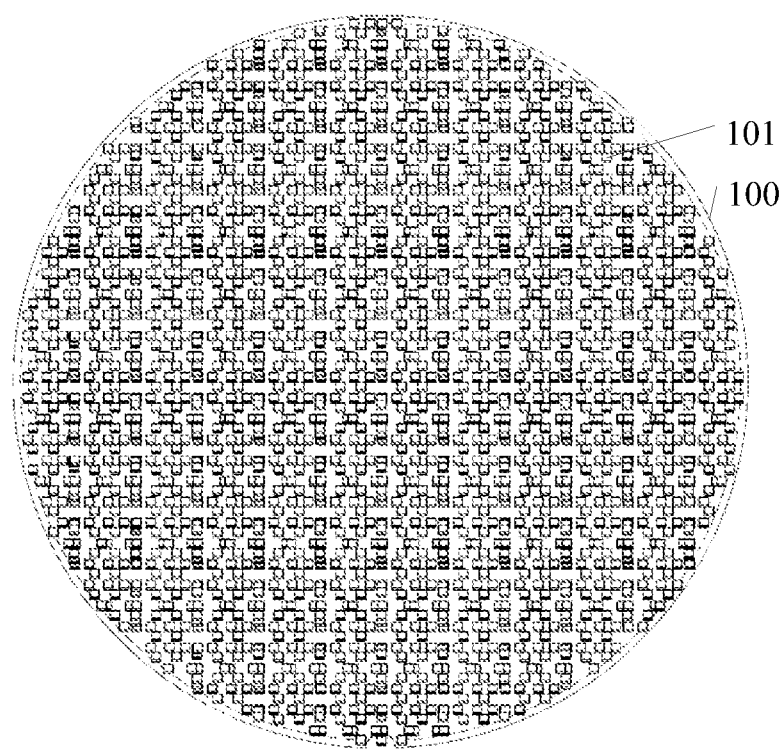
FIG. 1 is a schematic diagram of a dense map in an existing compensation method for overlay deviation of wafers.

FIG. 1 is a schematic diagram of a dense map in an existing compensation method for overlay deviation of wafers. Referring to FIG. 1, a dense map 100 includes all inspection positions 101 that can be used for performing overlay accuracy inspections on the wafers to be inspected. The dense map 100 includes a plurality of inspection sites (not shown). All the inspection positions 101 are distributed in the plurality of inspection sites.

The inspection sites of the dense map 100 correspond to shots.

A shot refers to an area covered by a lithography machine for one imaging. In a process of fabricating integrated circuits on a wafer, for convenience of process fabrication, the wafer is divided into several shots as basic units in production, and the shots are periodically and repeatedly arranged on the wafer.

Figure 2:
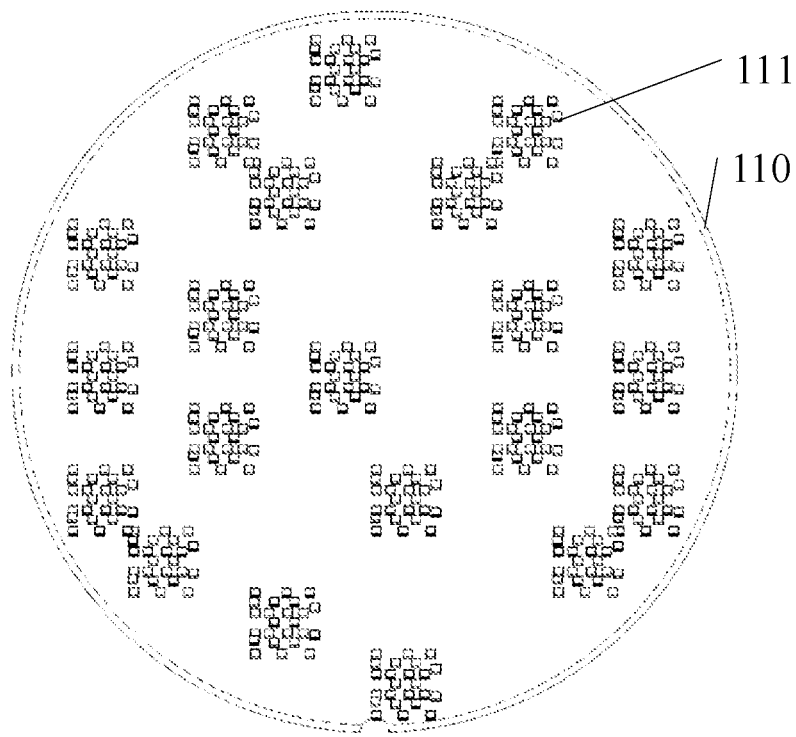
FIG. 2 is a schematic diagram of an inspection distribution map in an existing compensation method for overlay deviation of wafers.

FIG. 2 is a schematic diagram of an inspection distribution map in an existing compensation method for overlay deviation of wafers. Referring to FIG. 2, an inspection distribution map 110 is formed according to the dense map 100.

The inspection distribution map 110 includes a plurality of inspection positions 111.

The inspection distribution map 110 also includes a plurality of inspection sites (not shown), and the inspection sites of the inspection distribution map 110 also correspond to the shots, that is, the inspection sites of the inspection distribution map 110 correspond to the inspection sites of the dense map 100 in a one-to-one correspondence.

Alternatively, a method for forming the inspection distribution map 110 according to the dense map 100 includes: selecting a plurality of inspection sites from all the inspection sites of the dense map 100; and forming the inspection distribution map 110 according to the inspection positions 101 distributed in the selected plurality of inspection sites.

Therefore, a distribution of the inspection positions 111 on the inspection distribution map 110 corresponds to a distribution of the inspection positions 101 in the selected inspection sites from the dense map 100 on the dense map 100 in a one-to-one correspondence.

Shapes of the dense map 100 and the inspection distribution map 110 are the same as a shape of a wafer. Therefore, according to the inspection positions 101 of the inspection distribution map 110, the overlay accuracy can be inspected for corresponding positions on wafers to be inspected.

Next, the overlay accuracy information of each wafer to be inspected is obtained according to the inspection distribution map 110.

Figure 3:
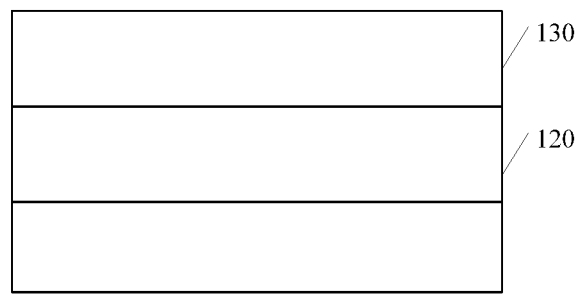
FIG. 3 is a schematic diagram of a cross-sectional structure of wafers to be inspected in an existing compensation method for overlay deviation of wafers.

FIG. 3 is a schematic diagram of a cross-sectional structure of first wafers in an existing compensation method for overlay deviation of wafers. Referring to FIG. 3, a first wafer in S121 includes a previous layer 120 and a current layer 130 on a surface of the previous layer 120.

Therefore, correspondingly, a wafer to be inspected in S122 includes the previous layer 120 and the current layer 130 on the surface of the previous layer 120.

Next, in S123, according to the inspection distribution map 110, the overlay accuracy between the current layer 130 and the previous layer 120 is inspected on the wafer to be inspected, at positions corresponding to each inspection position 111, to obtain the overlay accuracy information of each wafer to be inspected.

The overlay accuracy information refers to a collection of a plurality of overlay accuracies of each wafer to be inspected.

Next, in S124, the overlay deviation model of the entire wafer to be inspected is fitted according to the plurality of overlay accuracies.

Finally, in S130, a compensation is performed on the wafers of the current lot according to the overlay deviation model of the wafers of the first lot through the overlay deviation model of the wafers of the previous lot obtained from historical processing.

Figure 4:
FIG. 4 is a schematic diagram of a cross-sectional structure of second wafers in an existing compensation method for overlay deviation of wafers.

FIG. 4 is a schematic diagram of a cross-sectional structure of second wafers in an existing compensation method for overlay deviation of wafers. Referring to FIG. 4, the wafers of the current lot include a plurality of second wafers. The second wafers include a previous layer 220, a layer to be etched 230 on a surface of the previous layer 220, and a photoresist material layer 240 on a surface of the layer to be etched 230.

The previous layer 220 of the second wafers has a same pattern as the previous layer 120 of a first wafer.

The photoresist material layer 240 provides a material for a subsequent formed photolithography layer of the second wafers, and the layer to be etched 230 provides a material for a subsequent formed current layer of the second wafers.

The photoresist material layer 240 subsequently forms a patterned photolithography layer (not shown) through processes such as exposure, development, etc. A pattern of the photolithography layer is transferred to the layer to be etched 230 through processes such as etching, etc., to form the current layer of the second wafers.

Alternatively, performing the compensation on the wafers of the current lot according to the overlay deviation model of the wafers of the first lot through the overlay deviation model of the wafers of the previous lot means: obtaining a compensation parameter according to the overlay deviation model of the wafers of the first lot through the overlay deviation model of the wafers of the previous lot; and according to the compensation parameter, adjusting process parameters for forming the photolithography layer and the current layer of the second wafers, to form the photolithography layer and the current layer of the second wafers.

Through continuous iterative executions of S120 and S130, it is possible to continuously improve the overlay accuracy between the current layer and the previous layer of the wafers of the current lot.

However, in the above-mentioned embodiment, due to inaccuracy and poor precision of the overlay deviation model, the compensation parameter is inaccurate. As a result, pattern accuracy of the formed lithography layer and the current layer of the second wafers is poor. Alternatively, to reduce a time required for actual inspections of the overlay accuracy on the wafers to be inspected in S123, in a process of forming the inspection distribution map 110, a number of the selected inspection sites of the dense map 100 is small (approximately 20% of the total inspection sites), and the selected inspection sites are separated by a plurality of inspection sites that will not be actually inspected. Therefore, in the inspection distribution map 110, distances between different inspection sites where the inspection positions 111 are distributed are relatively long, resulting in relatively long distances between some of the inspection positions 111. Due to the long distances between some of the inspection positions 111, a model for the inspection sites that will not be actually inspected is mainly composed of a low-order model (such as a linear model) in the overlay deviation model. Therefore, when an actual overlay accuracy has nonlinear changes, the nonlinear changes cannot be fitted and predicted by the overlay deviation model. As a result, the obtained compensation parameter is inaccurate, resulting in inaccurate overlay deviation compensations on the second wafers, so that the overlay accuracy of some positions of the formed second wafers is still poor.

In another existing compensation method for overlay deviation of wafers, the inspections of the overlay accuracy are performed on the wafers of the previous lot directly according to the dense map to obtain the overlay deviation model. By performing the actual inspections of the overlay accuracy on all inspection positions, an overlay deviation model with higher accuracy can be obtained, so that the overlay accuracy of the wafers of the current lot can be improved. However, due to a need for the actual inspections of all inspection positions, a long inspection time is required, resulting in low efficiency of the overlay deviation compensation.

To solve the technical problems, the embodiments of the present disclosure provide a compensation method for overlay deviation. According to x first inspection distribution maps with no repeated inspection positions, a first iteration is performed on wafers of an n-th lot. Therefore, it is possible to obtain an n-th high-order overlay deviation model with higher accuracy and higher order. At a same time, efficiency of the first iteration is higher, thereby improving the overlay accuracy of semiconductor structures, and improving efficiency of an overlay deviation compensation.

To make the above objectives, features and beneficial effects of the present disclosure more obvious and understandable, alternative embodiments of the present disclosure will be described in detail below with reference to the accompanying drawings.

Figure 5:
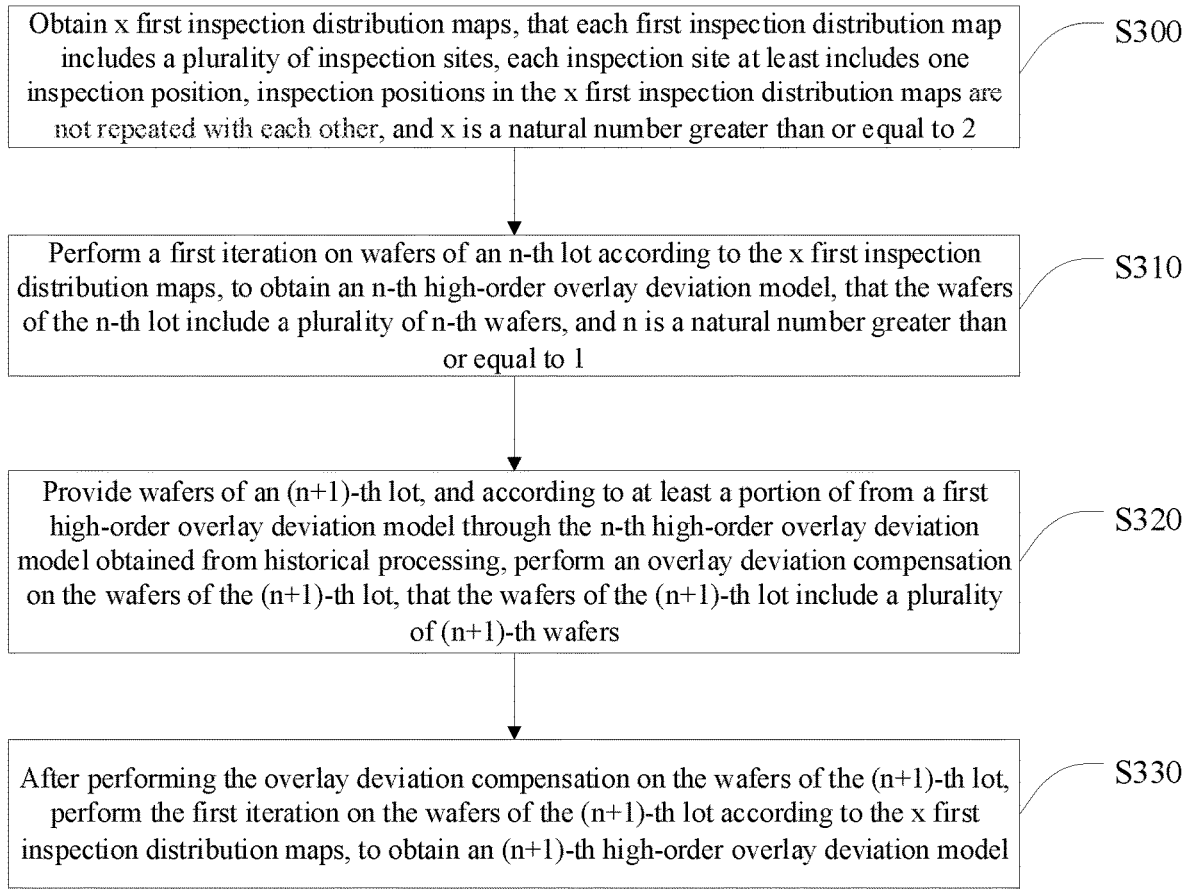
FIG. 5 is a schematic flowchart of a compensation method for overlay deviation according to various embodiments of the present disclosure.

FIG. 5 is a schematic flowchart of a compensation method for overlay deviation according to various embodiments of the present disclosure.

Referring to FIG. 5, the compensation method for overlay deviation includes: S300, S310, S320, and S330.

In S300, x first inspection distribution maps are obtained. Each first inspection distribution map includes a plurality of inspection sites. Each inspection site at least includes one inspection position. Inspection positions in the x first inspection distribution maps are not repeated with each other, and x is a natural number greater than or equal to 2.

In S310, a first iteration is performed on wafers of an n-th lot according to the x first inspection distribution maps, to obtain an n-th high-order overlay deviation model. The wafers of the n-th lot include a plurality of n-th wafers, and n is a natural number greater than or equal to 1.

In S320, wafers of an (n+1)-th lot are provided. According to at least a portion of from a first high-order overlay deviation model through the n-th high-order overlay deviation model obtained from historical processing, an overlay deviation compensation is performed on the wafers of the (n+1)-th lot. The wafers of the (n+1)-th lot include a plurality of (n+1)-th wafers.

In S330, after the overlay deviation compensation is performed on the wafers of the (n+1)-th lot, the first iteration is performed on the wafers of the (n+1)-th lot according to the x first inspection distribution maps, to obtain an (n+1)-th high-order overlay deviation model.

In one embodiment, the wafers of the n-th lot refer to wafers of a previous lot, and the wafers of the (n+1)-th lot refer to wafers of a current lot.

Figure 6:
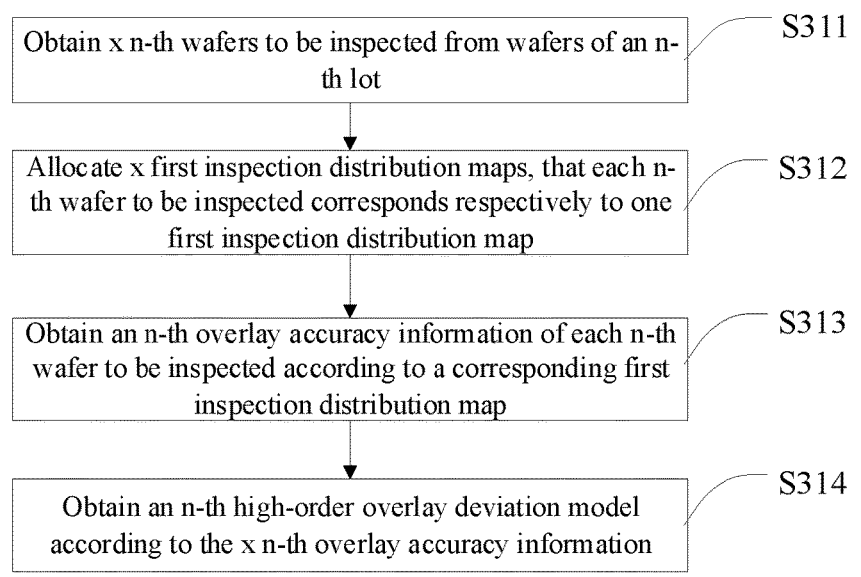
FIG. 6 is a schematic flowchart of a first iteration of S310 in FIG. 5.

FIG. 6 is a schematic flowchart of a first iteration of S310 in FIG. 5.

Referring to FIG. 6, a process of the first iteration includes: S311, S312, S313, and S314.

In S311, x n-th wafers to be inspected are obtained from the wafers of the n-th lot.

In S312, the x first inspection distribution maps are allocated, and each n-th wafer to be inspected corresponds respectively to one first inspection distribution map.

In S313, an n-th overlay accuracy information of each n-th wafer to be inspected is obtained according to the corresponding first inspection distribution map.

In S314, the n-th high-order overlay deviation model is obtained according to the x n-th overlay accuracy information.

The detailed description will be given below with reference to the drawings.

FIGS. 7 to 13 are schematic structural diagrams of various steps in a compensation method for overlay deviation according to various embodiments of the present disclosure.

Figure 7:
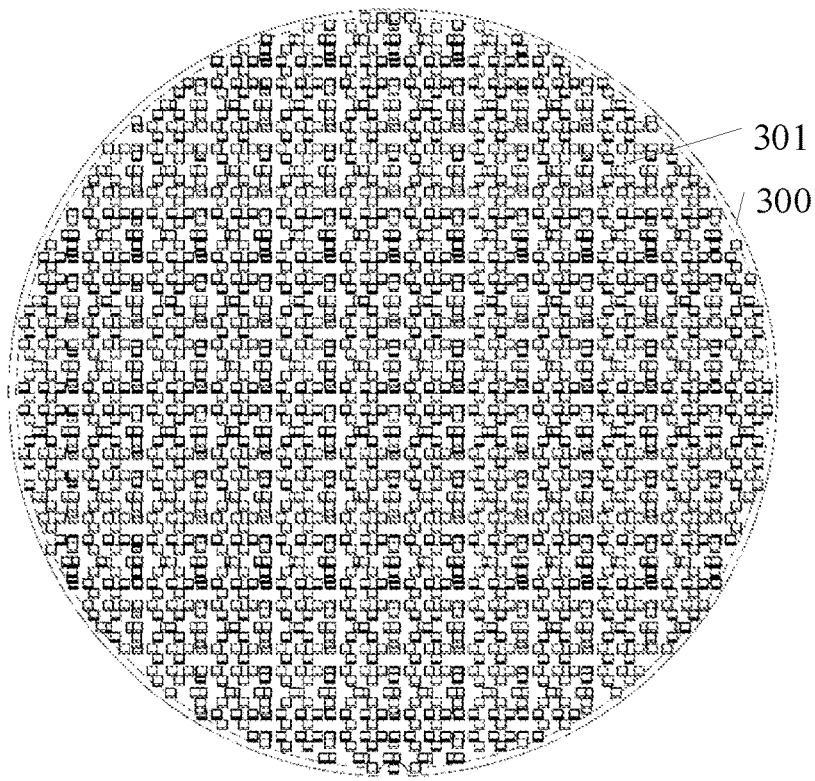
FIGS. 7 to 13 are structural schematic diagrams of various steps in a compensation method for overlay deviation according to various embodiments of the present disclosure.

FIG. 7 is a schematic diagram of a dense map according to various embodiments of the present disclosure. Referring to FIG. 7, an inspection position information database is provided. The inspection position information database includes a plurality of inspection positions 301 that are not repeated with each other.

Alternatively, in one embodiment, the inspection position information database is a dense map 300.

The dense map 300 includes all inspection positions 301 that can be used to perform overlay accuracy inspections on a current layer of n-th wafers to be inspected and (n+1)-th wafers to be inspected. The dense map 300 includes a plurality of inspection sites (not shown). All the inspection positions 301 are distributed in the plurality of inspection sites, and the inspection sites of the dense map 300 correspond to shots in a one-to-one correspondence.

In other embodiments, the inspection position information database is a database, and the database includes data that can define all inspection positions, such as coordinates of the inspection positions, etc.

For ease of understanding, the dense map 300 shown in FIG. 7 only schematically shows locations and a number of the inspection positions 301, and the locations and the number of the inspection positions 301 in the dense map 300 are determined based on factors such as actual design requirements, measurement requirements, testing conditions, etc.

Figure 8:
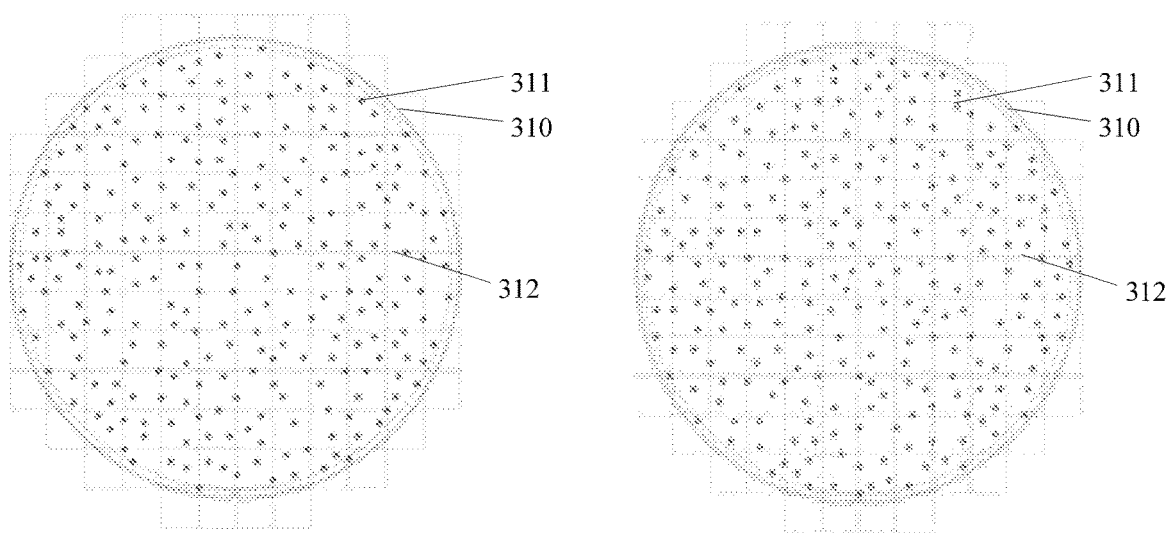

FIG. 8 is a schematic diagram of first inspection distribution maps according to various embodiments of the present disclosure. Referring to FIG. 8, x first inspection distribution maps 310 are obtained. Each first inspection distribution map 310 includes a plurality of inspection sites 312. Each inspection site 312 at least includes one inspection position 311. Inspection positions 311 in the x first inspection distribution maps are not repeated with each other, and x is a natural number greater than or equal to 2.

FIG. 8 schematically shows a schematic diagram of two first inspection distribution maps 310, and, for ease of understanding, the inspection positions 311 are represented as dots.

The plurality of inspection sites 312 of the first inspection distribution maps 310 correspond to the shots in a one-to-one correspondence.

In one embodiment, the inspection positions 311 of each first inspection distribution map 310 are obtained from the inspection position information database.

In one embodiment, since the inspection position information database is the dense map 300, obtaining the inspection positions 311 of each first inspection distribution map 310 from the inspection position information database means that each inspection position 311 corresponds to one inspection position 301 in the dense map 300. Moreover, since the plurality of inspection sites 312 of the first inspection distribution maps 310 correspond to the shots, the plurality of inspection sites 312 of each first inspection distribution map 310 correspond to the plurality of inspection sites of the dense map 300 in a one-to-one correspondence.

In one embodiment, a sum of numbers of the inspection positions 311 of the x first inspection distribution maps 310 is the same as a total number of the inspection positions 301 in the inspection position information database, that is, all the inspection positions 311 of the x first inspection distribution maps 310 correspond respectively to all the inspection positions 301 of the dense map 300 in a one-to-one correspondence.

Since the sum of the numbers of the inspection positions 311 of the x first inspection distribution maps 310 is the same as the total number of the inspection positions 301 in the inspection position information database, by performing inspections on the x n-th wafers to be inspected based on the x first inspection distribution maps 310, actual measurement of the overlay accuracy can be performed at least once on positions in the n-th wafers to be inspected corresponding to all inspectable inspection positions 301, thereby further improving the accuracy of the n-th high-order overlay deviation model.

In other embodiments, the sum of the numbers of the inspection positions of the x first inspection distribution maps is less than the total number of the inspection positions in the inspection position information database, that is, not all inspection positions have at least once the actual measurement of the overlay accuracy. Therefore, actual measurement time of the n-th wafers to be inspected and the (n+1)-th wafers to be inspected is reduced, and an amount of fitting computation and time to obtain an n-th high-order overlay deviation model and an (n+1)-th high-order overlay deviation model is reduced, thereby improving efficiency of the overlay deviation compensation process.

In one embodiment, since the sum of the numbers of the inspection positions 311 of the x first inspection distribution maps 310 is the same as the total number of the inspection positions 301 in the inspection position information database, the number x of the inspection distribution maps 310 depends on the number of the inspection positions 301 of the dense map 300 and a number of the inspection positions 311 of each first inspection distribution map 310. In other embodiments, the number of the first inspection distribution maps can also be preset according to actual demand for the overlay deviation compensation.

In one embodiment, in the x first inspection distribution maps 310, a difference between the numbers of the inspection positions 311 of different first inspection distribution maps 310 is within 15.

Since the difference between the numbers of the inspection positions in different first inspection distribution maps 310 is within 15, the number of the inspection positions 311 in each first inspection distribution map 310 is more uniform, which reduces an inspection process deviation between the n-th wafers to be inspected and between the (n+1)-th wafers to be inspected, which is beneficial to better improve the accuracy of the n-th high-order overlay deviation model and the (n+1)-th high-order overlay deviation model. In addition, a deviation between inspection time of the n-th wafers to be inspected and between inspection time of the (n+1)-th wafers to be inspected can be reduced, which is beneficial to management and control of the overlay deviation compensation process during a production process.

Alternatively, it is best when the difference is within two.

The number of the inspection positions 311 in each first inspection distribution map 310 is less than or equal to 600, thus reducing the inspection time of the overlay accuracy of each n-th wafer to be inspected and each (n+1)-th wafer to be inspected, and being conducive to improving inspection efficiency of the overlay accuracy of each n-th wafer to be inspected and each (n+1)-th wafer to be inspected.

Alternatively, when the number of the inspection positions 311 in each first inspection distribution map 310 is less than 300, the inspection accuracy and the inspection efficiency can be better balanced.

In one embodiment, the method for obtaining the x first inspection distribution maps 310 further includes: providing an edge-to-center ratio factor; and obtaining the x first inspection distribution maps 310 according to the edge-to-center ratio factor, such that a distribution of the plurality of inspection positions 311 of each first inspection distribution map 310 on the entire first inspection distribution map 310 conforms to the edge-to-center ratio factor.

The edge-to-center ratio factor refers to a ratio of the number of the inspection positions 311 distributed in the inspection sites 312 corresponding to the shots near a center of a wafer, to the number of the inspection positions 311 distributed in the inspection sites 312 corresponding to the shots near an edge of the wafer.

The x first inspection distribution maps 310 are obtained according to the edge-to-center ratio factor, and the distribution of the plurality of inspection positions 311 of each first inspection distribution map 310 on the entire first inspection distribution map 310 conforms to the edge-to-center ratio factor. Therefore, in different current layers, it is possible to increase the inspection positions 311 of the inspection sites 312 corresponding to areas that are prone to defects, etc., which reduce the overlay accuracy. Thus, in a process of obtaining the n-th high-order overlay deviation model, it is possible to increase a number of positions for actual inspections of the overlay accuracy for the areas that are prone to defects, and add more reference samples for ranges of the overlay accuracy that may have sudden changes, so as to further improve the accuracy of the n-th high-order overlay deviation model and the (n+1)-th high-order overlay deviation model.

Figure 9:
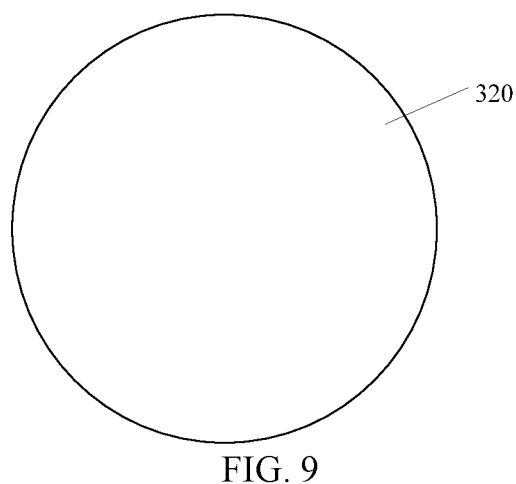
Figure 10:
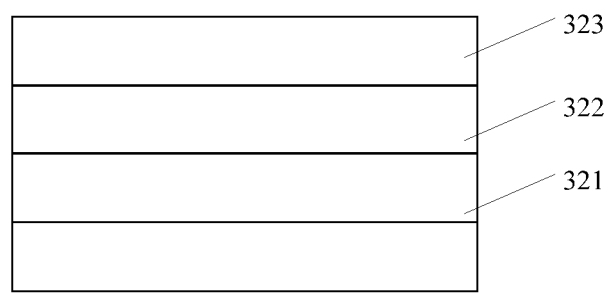
Figure 11:
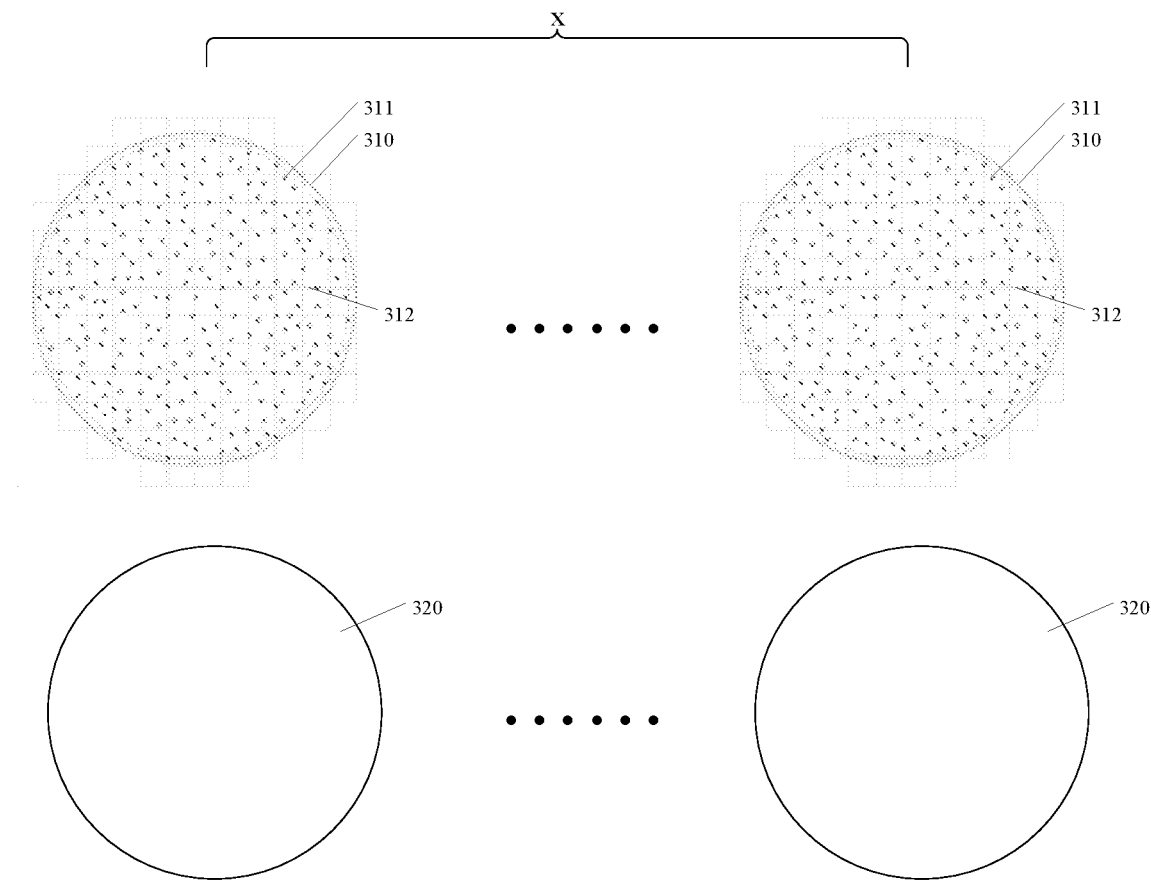

Next, the first iteration is performed on the wafers of the n-th lot according to the x first inspection distribution maps 310 to obtain the n-th high-order overlay deviation model. FIGS. 9 to 11 can be referred to for an alternative process to perform the first iteration.

FIG. 9 is a schematic top view of an n-th wafer to be inspected according to various embodiments of the present disclosure, and FIG. 10 is a schematic cross-sectional view of the n-th wafer to be inspected in FIG. 9. Referring to FIGS. 9 to 10, wafers of an n-th lot are provided. The wafers of the n-th lot include a plurality of n-th wafers, and n is a natural number greater than or equal to 1. x n-th wafers to be inspected 320 are obtained from the wafers of the n-th lot.

Alternatively, in one embodiment, x n-th wafers in the plurality of n-th wafers are used as the n-th wafers to be inspected 320.

In one embodiment, each n-th wafer to be inspected 320 includes: a previous layer 321, a current layer 322 to be etched on a surface of the previous layer 321, and a patterning layer 323 on a surface of the current layer 322 to be etched.

The patterning layer 323 is a photoresist layer for patterning the current layer 322 to be etched.

Since the current layer 322 has not been patterned, after obtaining the n-th high-order overlay deviation model, the overlay deviation compensation can be performed on the wafers of the n-th lot, to improve the overlay accuracy of the wafers of the n-th lot. Alternatively, after obtaining the n-th high-order overlay deviation model, the patterning layer 323 is removed. After the patterning layer 323 is removed, a new patterning layer is formed on the surface of the current layer 322 to be etched. When the new patterning layer is formed, the overlay deviation compensation is performed on the new patterning layer according to the n-th high-order overlay deviation model, thereby reducing the overlay deviation between the new patterning layer and the previous layer 321, and improving the overlay accuracy of the new patterning layer, so as to improve the overlay accuracy of the current layer 322 after etching.

In other embodiments, the n-th wafers to be inspected include: a previous layer and a current layer that has been patterned (etched) on a surface of the previous layer.

FIG. 11 is a schematic diagram of S312 in FIG. 6. Referring to FIG. 11, the x first inspection distribution maps 310 are allocated, and each n-th wafer 320 to be inspected corresponds respectively to one first inspection distribution map 310.

Continuing to refer to FIG. 11, an n-th overlay accuracy information of each n-th wafer 320 to be inspected is obtained according to the corresponding first inspection distribution map 310.

Alternatively, obtaining the n-th overlay accuracy information of each n-th wafer 320 to be inspected according to the corresponding first inspection distribution map 310 means that: in the corresponding first inspection distribution map 310 and the n-th wafer 320 to be inspected, inspecting a plurality of overlay accuracies between the patterning layer 323 and the previous layer 321, at a plurality of positions on the n-th wafer 320 to be inspected, corresponding to a plurality of inspection positions 311 of the n-th wafer 320 to be inspected. The n-th overlay accuracy information of each n-th wafer 320 to be inspected refers to a collection of the plurality of overlay accuracies of the n-th wafer 320 to be inspected.

Continuing to refer to FIG. 11, the n-th high-order overlay deviation model is obtained according to the x n-th overlay accuracy information.

In one embodiment, a method for obtaining the n-th high-order overlay deviation model according to the x n-th overlay accuracy information includes: fitting the x n-th overlay accuracy information to obtain the n-th high-order overlay deviation model.

Alternatively, each inspection position 311 and a corresponding inspection result (overlay accuracy) are taken as one sample data. All the inspection positions 311 of the x first inspection distribution maps 310 are spliced. All the inspection positions 311 and the corresponding inspection results are used as sample data to obtain the n-th high-order overlay deviation model.

Since the first iteration is performed on the wafers of the n-th lot according to the x first inspection distribution maps 310 in which the inspection positions 311 are not repeated with each other, it is possible to obtain the n-th higher-order overlay deviation model with higher accuracy. At a same time, the efficiency of the first iteration is higher.

Alternatively, the x first inspection distribution maps 310 are obtained. Each first inspection distribution map 310 has the plurality of inspection positions 311. The plurality of inspection positions 311 of different first inspection distribution maps 310 do not repeat with each other, and x is a natural number greater than or equal to 2. Each first inspection distribution map 310 includes the plurality of inspection sites 312, and each inspection site 312 at least includes one inspection position 311. Therefore, it is possible to obtain two or more first inspection distribution maps 310 with completely different inspection positions 311. At a same time, the inspection positions 311 in each first inspection distribution map 310 can be uniformly distributed on the entire first inspection distribution map 310, and distances between the inspection positions 311 are relatively small and more uniform.

On this basis, the x first inspection distribution maps 310 are allocated, and each n-th wafer 320 to be inspected corresponds to one first inspection distribution map 310. According to the corresponding first inspection distribution map 310, the n-th overlay accuracy information of each n-th wafer 320 to be inspected is obtained. Therefore, in each site of each n-th wafer 320 to be inspected corresponding to a respective shot, the overlay accuracy of one or more positions is the overlay accuracy obtained from the actual inspections. In addition, in respective sites of the n-th wafers 320 to be inspected corresponding to a same shot, the overlay accuracy of positions corresponding to different inspection positions 311 can be obtained from the actual inspections. At a same time, a plurality of positions on each n-th wafer 320 to be inspected that are actually inspected for the overlay accuracy can be evenly distributed on the entire n-th wafer 320, and the distances between the plurality of positions are smaller and more uniform.

On one hand, since the overlay accuracy of different inspection positions 311 can be obtained from the actual inspections in a site corresponding to each shot, the n-th high-order overlay deviation model with a nonlinear model at the site corresponding to each shot can be obtained according to the x n-th overlay accuracy information, thereby improving the accuracy of the overlay deviation model. Subsequently, according to the first high-order overlay deviation model through the n-th high-order overlay deviation model obtained from historical processing, a more accurate compensation parameter can be obtained, so that the wafers of the (n+1)-th lot can be compensated more accurately, to improve the overlay accuracy of the wafers of the (n+1)-th lot, that is, by continuously performing the process of the first iteration, the overlay accuracy of the wafers of the current lot can be continuously improved.

On another hand, two or more first inspection distribution maps 310 are allocated, and each n-th wafer 320 to be inspected corresponds to one first inspection distribution map 310. According to the corresponding first inspection distribution map 310, the n-th overlay accuracy information of each n-th wafer to be inspected 320 is obtained, that is, in the n-th lot, different wafers to be inspected are inspected for the overlay accuracy according to different first inspection distribution maps 310. Therefore, while inspecting more inspection positions, the inspection time spent in the inspection process is reduced, thereby improving the efficiency of the overlay deviation compensation. In summary, the compensation method for overlay deviation not only improves the overlay accuracy of semiconductor structures, but also improves the efficiency of the overlay deviation compensation.

Figure 12:
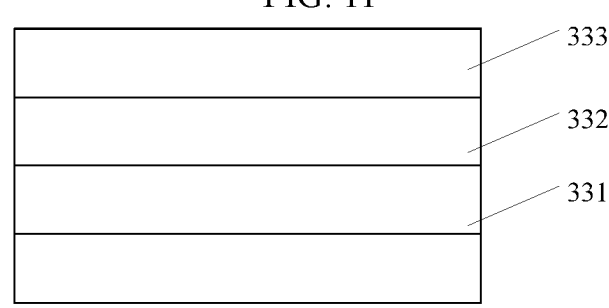

FIG. 12 is a schematic cross-sectional structure diagram of an (n+1)-th wafer before compensation according to various embodiments of the present disclosure. Referring to FIG. 12, wafers of an (n+1)-th lot are provided. The wafers of the (n+1)-th lot include a plurality of (n+1)-th wafers.

In one embodiment, the (n+1)-th wafers include: a previous layer 331, a current layer 332 to be etched on a surface of the previous layer 331, and a photoresist material layer 333 on a surface of the current layer 332 to be etched.

The photoresist material layer 333 provides a material for forming a patterning layer of the (n+1)-th wafers.

Figure 13:
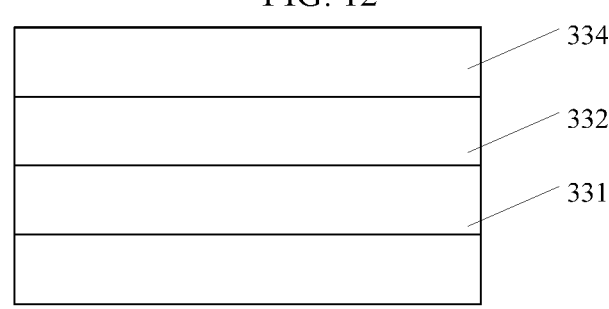

FIG. 13 is a schematic diagram of a cross-sectional structure of an (n+1)-th wafer after compensation according to various embodiments of the present disclosure. Referring to FIG. 13, according to at least a portion of from the first high-order overlay deviation model through the n-th high-order overlay deviation model obtained from historical processing, the overlay deviation compensation is performed on the wafers of the (n+1)-th lot.

Alternatively, since the wafers of the first lot through the wafers of the n-th lot all perform S310, the first high-order overlay deviation model through the n-th high-order overlay deviation model can be obtained. When processing the wafers of the (n+1)-th lot, at least a portion of from the first high-order overlay deviation model through the n-th high-order overlay deviation model obtained from historical processing can be used as a basis, to perform the compensation on the wafers of the (n+1)-th lot.

According to at least a portion of from the first high-order overlay deviation model through the n-th high-order overlay deviation model obtained from historical processing, the overlay deviation compensation is performed on the wafers of the (n+1)-th lot, that is, according to a plurality of high-order overlay deviation models, the overlay deviation compensation is performed, therefore, stability of the overlay deviation compensation is improved.

In one embodiment, a method to perform the overlay deviation compensation on the wafers of the (n+1)-th lot, according to at least a portion of from the first high-order overlay deviation model through the n-th high-order overlay deviation model obtained from historical processing, includes: obtaining a compensation parameter $P_{n+1}$ according to a first high-order overlay deviation model $M_1$ through an n-th high-order overlay deviation model $M_n$; and according to the compensation parameter $P_{n+1}$, adjusting process parameters for forming a patterning layer 334 (as shown in FIG. 13) to form the patterning layer 334 of the (n+1)-th wafers with higher overlay accuracy.

In one embodiment, $$P_{n+1} = \sum_{1}^{n} \lambda_n M_n,$$

where, $\lambda_n$ is a weight coefficient of the n-th high-order overlay deviation model $M_n$, that is, each high-order overlay deviation model M corresponds to its own weighting coefficient $\lambda$. For example, $\lambda_1$ is the weighting coefficient of the first high-order overlay deviation model $M_1$, $\lambda_2$ is the weighting coefficient of the second high-order overlay deviation model $M_2$, and so on.

Therefore, it is possible to adjust a degree of participation of each high-order overlay deviation model when obtaining the compensation parameter according to actual conditions of wafers of each lot such as pattern accuracy, defects, inspection process, etc., thereby improving flexibility of the overlay deviation compensation, and further improving the accuracy of the overlay deviation compensation.

The weighting coefficient X can be zero, that is, according to actual conditions, a portion or all of from the first high-order overlay deviation model $M_1$ through the n-th high-order overlay deviation model $M_n$ can be used as a basis for obtaining the compensation parameter $P_{n+1}$.

In one embodiment, $\lambda_n = f(n, \Delta t_n)$, where, $\Delta t_n = t_{n+1} - t_n$, t is a time when a compensation is performed on wafers of each lot, and the time is, for example, a start time of the compensation, an end time of the compensation, and so on.

In one embodiment, since the unetched current layer 332 is subsequently etched according to the patterning layer 334, the current layer (not shown) with higher overlay accuracy can be formed.

In other embodiments, it is also possible to adjust parameters of a patterning process (etching process, cleaning process, etc.) according to the compensation parameter when the current layer is patterned to form the current layer with higher overlay accuracy.

Continuing to refer to FIG. 13, after the overlay deviation compensation is performed on the wafers of the (n+1)-th lot, the first iteration is performed on the wafers of the (n+1)-th lot according to the x first inspection distribution maps, to obtain the (n+1)-th high-order overlay deviation model.

An alternative method of performing the first iteration on the wafers of the (n+1)-th lot is the same as the method of performing the first iteration on the wafers of the n-th lot, and will not be repeated here.

Therefore, by continuously iteratively executing S310, S320, and S330, it is possible to continuously improve the overlay accuracy of the wafers of the current lot.

Figure 14:
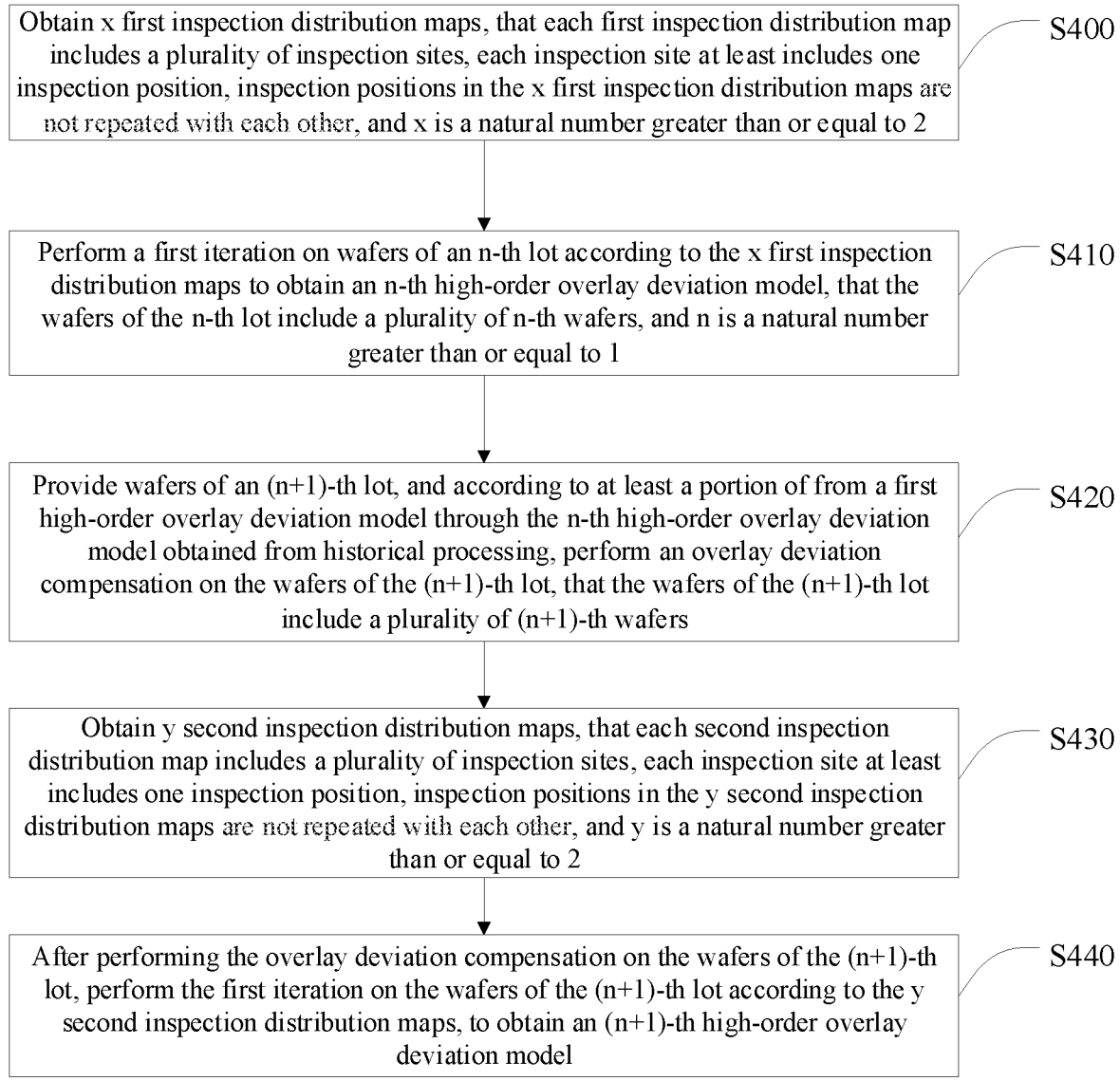
FIG. 14 is a schematic flowchart of a compensation method for overlay deviation according to various embodiments of the present disclosure.

FIG. 14 is a schematic flowchart of a compensation method for overlay deviation according to various embodiments of the present disclosure.

Referring to FIG. 14, the compensation method for overlay deviation includes: S400, S410, S420, and S430.

In S400, x first inspection distribution maps are obtained. Each first inspection distribution map includes a plurality of inspection sites. Each inspection site at least includes one inspection position. Inspection positions in the x first inspection distribution maps are not repeated with each other, and x is a natural number greater than or equal to 2.

In S410, a first iteration is performed on wafers of an n-th lot according to the x first inspection distribution maps to obtain an n-th high-order overlay deviation model. The wafers of the n-th lot include a plurality of n-th wafers, and n is a natural number greater than or equal to 1.

In S420, wafers of an (n+1)-th lot are provided. According to at least a portion of from a first high-order overlay deviation model through the n-th high-order overlay deviation model obtained from historical processing, an overlay deviation compensation is performed on the wafers of the (n+1)-th lot. The wafers of the (n+1)-th lot include a plurality of (n+1)-th wafers.

In S430, y second inspection distribution maps are obtained. Each second inspection distribution map includes a plurality of inspection sites. Each inspection site at least includes one inspection position. Inspection positions in the y second inspection distribution maps are not repeated with each other, and y is a natural number greater than or equal to 2.

In S440, after the overlay deviation compensation is performed on the wafers of the (n+1)-th lot, the first iteration is performed on the wafers of the (n+1)-th lot according to the y second inspection distribution maps, to obtain an (n+1)-th high-order overlay deviation model.

In one embodiment, the wafers of the n-th lot refer to wafers of a previous lot, and the wafers of the (n+1)-th lot refer to wafers of a current lot.

A method of performing S400, S410, and S420 in one embodiment is the same as the method of performing S300, S310, and S320 in the embodiment shown in FIG. 5 to FIG. 13, and will not be repeated here. In one embodiment, a main difference from the embodiment shown in FIG. 5 to FIG. 13 lies in a method of obtaining the (n+1)-th high-order overlay deviation model.

The y second inspection distribution maps are obtained, and the first iteration is performed on the wafers of the (n+1)-th lot according to the y second inspection distribution maps, to obtain the (n+1)-th high-order overlay deviation model, that is, for wafers to be inspected of wafers of each lot, an inspection overlay accuracy information is obtained according to the re-obtained second inspection distribution maps, therefore, randomness of positions on the wafers to be inspected for each lot to inspect the overlay accuracy is increased, and, the more a number of iterations of the first iteration, the more accurate the (n+1)-th high-order overlay deviation model, thereby improving the accuracy of the subsequent overlay deviation compensation.

The detailed description will be given below with reference to the drawings.

FIG. 15 is a schematic diagram of second inspection distribution maps according to various embodiments of the present disclosure.

Referring to FIG. 15 on the basis of FIG. 7 to FIG. 13, y second inspection distribution maps 410 are obtained. Each second inspection distribution map 410 includes a plurality of inspection sites 412. Each inspection site 412 at least includes one inspection position 411. Inspection positions 411 in the y second inspection distribution maps 410 are not repeated with each other, and y is a natural number greater than or equal to 2.

FIG. 15 schematically shows a schematic diagram of two second inspection distribution maps 410, and, for ease of understanding, the inspection positions 411 are represented as dots.

The plurality of inspection sites 412 of the second inspection distribution maps 410 correspond to the shots in a one-to-one correspondence.

In one embodiment, the inspection positions 411 of each second inspection distribution map 410 are obtained from the inspection position information database.

In one embodiment, since the inspection position information database is the dense map 300, obtaining the inspection positions 411 of each second inspection distribution map 410 from the inspection position information database means that each inspection position 411 corresponds to one inspection position 301 in the dense map 300. Moreover, since the plurality of inspection sites 412 of the second inspection distribution maps 410 correspond to the shots, the plurality of inspection sites 412 of each second inspection distribution map 410 corresponds to the plurality of inspection sites of the dense map 300 in a one-to-one correspondence.

In one embodiment, a sum of numbers of the inspection positions 411 of the y second inspection distribution maps 410 is the same as the total number of the inspection positions 301 in the inspection position information database, that is, all the inspection positions 411 of the y second inspection distribution maps 410 correspond respectively to all the inspection positions 301 of the dense map 300 in a one-to-one correspondence.

Since the sum of the numbers of the inspection positions 411 of the y second inspection distribution maps 410 is the same as the total number of the inspection positions 301 in the inspection position information database, by performing inspections on the (n+1)-th wafers to be inspected according to the y second inspection distribution maps 410, actual measurement of the overlay accuracy is performed at least once on positions of the (n+1)-th wafers to be inspected corresponding to all inspectable inspection positions 301, thereby further improving the accuracy of the (n+1)-th high-order overlay deviation model.

In other embodiments, the sum of the numbers of the inspection positions of the y second inspection distribution maps is less than the total number of the inspection positions in the inspection position information database, that is, not all inspection positions have at least once actual measurement of the overlay accuracy. Therefore, an actual measurement time for the overlay accuracy of the (n+1)-th wafers to be inspected is reduced, and an amount of fitting computation and time for obtaining the (n+1)-th high-order overlay deviation model is reduced, thereby improving the efficiency of the overlay deviation compensation process.

In one embodiment, since the sum of the numbers of the inspection positions 411 of the y second inspection distribution maps 410 is the same as the total number of the inspection positions 301 in the inspection position information database, the number y of the second inspection distribution maps 410 depends on the number of the inspection positions 301 of the dense map 300 and a number of the inspection positions 411 of each second inspection distribution map 410. In other embodiments, the number of the second inspection distribution maps can also be preset according to actual demand for the overlay deviation compensation.

In one embodiment, in the y second inspection distribution maps 410, a difference between the numbers of the inspection positions 411 in different second inspection distribution maps 410 is within 15.

Since the difference between the numbers of the inspection positions 411 in different second inspection distribution maps 410 is within 15, the number of the inspection positions 411 in each second inspection distribution map 410 is more uniform, and an inspection process deviation between each (n+1)-th wafer to be inspected is reduced, thereby being beneficial to better improve the accuracy of the (n+1)-th high-order overlay deviation model. A deviation between inspection time required to inspect each (n+1)-th wafer to be inspected is reduced, thereby being conducive to the management and control of the overlay deviation compensation process in the production process.

Alternatively, it is best when the difference is within two.

The number of the inspection positions 411 in each second inspection distribution map 410 is less than or equal to 600. Therefore, the inspection time for the overlay accuracy of each (n+1)-th wafer to be inspected is reduced, which is beneficial to improve the inspection efficiency of the overlay accuracy of the (n+1)-th wafer to be inspected.

Alternatively, when the number of the inspection positions 411 in each second inspection distribution map 410 is less than 300, the inspection accuracy and the inspection efficiency can be better balanced.

In one embodiment, the method for obtaining the y second inspection distribution maps 410 further includes: providing an edge-to-center ratio factor; and obtaining the y second inspection distribution maps 410 according to the edge-to-center ratio factor, such that a distribution of the plurality of inspection positions 411 of each second inspection distribution map 410 on the entire second inspection distribution map 410 conforms to the edge-to-center ratio factor.

The y second inspection distribution maps 410 are obtained according to the edge-to-center ratio factor, and the distribution of the plurality of inspection positions 411 of each second inspection distribution map 410 on the entire second inspection distribution map 410 conforms to the edge-to-center ratio factor. Therefore, in different current layers, it is possible to increase the inspection positions 411 of the inspection sites 412 corresponding to areas that are prone to defects, etc., which reduce the overlay accuracy, so as in a process of obtaining the (n+1)-th high-order overlay deviation model, it is possible to increase a number of positions for actual inspections of the overlay accuracy for the areas that are prone to detects, and add more reference samples for ranges of the overlay accuracy that may have sudden changes, so as to further improve the accuracy of the (n+1)-th high-order overlay deviation model.

In one embodiment, each second inspection distribution map 410 includes the plurality of inspection sites 412. Each inspection site 412 at least includes one inspection position 411. Inspection positions 411 in the y second inspection distribution maps 410 are not repeated with each other, and y is a natural number greater than or equal to 2. That is, rules for obtaining the second inspection distribution maps 410 are similar to rules for obtaining the first inspection distribution maps 310. Therefore, between the plurality of inspection positions 411 of one second distribution map 410 and the plurality of inspection positions 311 of one first inspection distribution map 310, it is possible that some or all of the inspection positions 411 and the inspection positions 311 correspond to same inspection positions 301.

In one embodiment, y is equal to x. Therefore, consistency of the rules for obtaining the first inspection distribution maps 310 and the rules for obtaining the second inspection distribution maps 410 is improved, and difficulty of computation when obtaining the first inspection distribution maps 310 and the second inspection distribution maps 410 is reduced.

In other embodiments, y is not equal to x. Therefore, randomness of obtaining the inspection distribution maps every time is further improved.

Continuing to refer to FIG. 15, after the overlay deviation compensation is performed on the wafers of the (n+1)-th lot, the first iteration is performed on the wafers of the (n+1)-th lot according to the y second inspection distribution maps 410, to obtain the (n+1)-th high-order overlay deviation model.

Alternatively, compared with using the x first inspection distribution maps 310 to perform the first iteration on the wafers of the n-th lot, performing the first iteration on the wafers of the (n+1)-th lot according to the y second inspection distribution maps 410 refers to: by using the y second inspection distribution maps 410 instead of the x first inspection distribution maps 310, performing the first iteration on the wafers of the (n+1)-th lot.

A method of the first iteration in one embodiment is the same as the method of the first iteration in the embodiment shown in FIG. 5 to FIG. 13, and will not be repeated here.

Therefore, by continuously iteratively executing steps S400 to S440, the overlay accuracy of the wafers of the current lot can be continuously improved.

FIG. 16 is a schematic flowchart of a compensation method for overlay deviation according to various embodiments of the present disclosure.

Referring to FIG. 16, the compensation method of the overlay deviation includes: S500, S510, and S520.

In S500, x first inspection distribution maps are obtained. Each first inspection distribution map includes a plurality of inspection sites. Each inspection site at least includes one inspection position. Inspection positions in the x first inspection distribution maps are not repeated with each other, and x is a natural number greater than or equal to 2.

In S510, a first iteration is performed on wafers of an n-th lot according to the x first inspection distribution maps to obtain an n-th high-order overlay deviation model. The wafers of the n-th lot include p groups of wafers. Each group of the p groups of wafers includes a plurality of n-th wafers, where n is a natural number greater than or equal to 1, and p is a natural number greater than or equal to 2.

In S520, wafers of an (n+1)-th lot are obtained. The first iteration is performed on the wafers of the (n+1)-th lot according to the x first inspection distribution maps, to obtain an (n+1)-th high-order overlay deviation model. The wafers of the (n+1)-th lot include t groups of wafers, t is a natural number greater than or equal to 2, and each group of the t groups of wafers includes a plurality of (n+1)-th wafers.

A process of the first iteration in S510 includes: S511, S512, S513, and S514.

In S511, x n-th wafers to be inspected are obtained.

In S512, the x first inspection distribution maps are allocated. Each n-th wafer to be inspected corresponds respectively to one first inspection distribution map.

In S513, an n-th overlay accuracy information of each n-th wafer to be inspected is obtained according to the corresponding first inspection distribution map.

In S514, the n-th high-order overlay deviation model is obtained according to the x n-th overlay accuracy information.

In one embodiment, wafers of each group in the p groups of wafers and wafers of each group in the t groups of wafers refer to wafers of one lot in an actual semiconductor manufacturing process. The wafers of the n-th lot refer to all wafers that have completed a previous first iteration process, and the wafers of the (n+1)-th lot refer to all wafers that have completed a current first iteration process.

The detailed description will be given below with reference to the drawings.

FIGS. 17 to 22 are structural schematic diagrams of various steps in a compensation method for overlay deviation according to various embodiments of the present disclosure.

Figure 17:
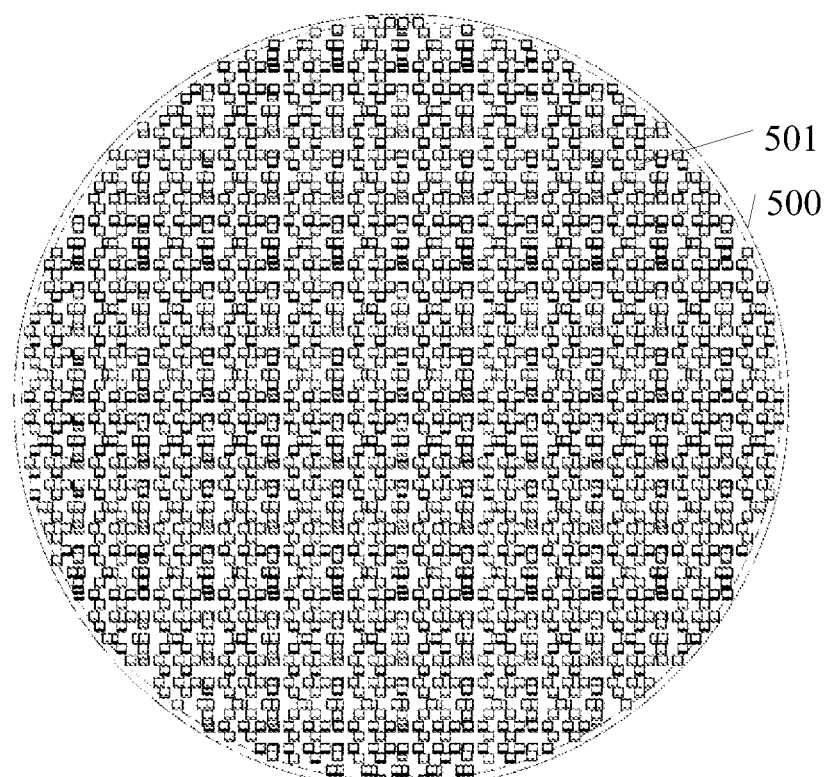
FIGS. 17 to 22 are structural schematic diagrams of various steps in a compensation method for overlay deviation according to various embodiments of the present disclosure.

FIG. 17 is a schematic diagram of a dense map according to various embodiments of the present disclosure. Referring to FIG. 17, an inspection position information database is provided. The inspection position information database includes a plurality of inspection positions 501 that are not repeated with each other.

Alternatively, in one embodiment, the inspection position information database is a dense map 500.

The dense map 500 includes all inspection positions 501 that can be used to perform the overlay accuracy inspections on a current layer of n-th wafers to be inspected and (n+1)-th wafers to be inspected. The dense map 500 includes a plurality of inspection sites (not shown). All the inspection positions 501 are distributed in the plurality of inspection sites. The inspection sites of the dense map 500 correspond to the shots in a one-to-one correspondence.

In other embodiments, the inspection position information database is a database, and the database includes data that can define all inspection positions, such as coordinates of the inspection positions, etc.

For ease of understanding, the dense map 500 shown in FIG. 17 only schematically shows positions and a number of the inspection positions 501. The positions and the number of the inspection positions 501 in the dense map 500 are determined based on factors such as actual design requirements, measurement requirements, testing conditions, etc.

Figure 18:
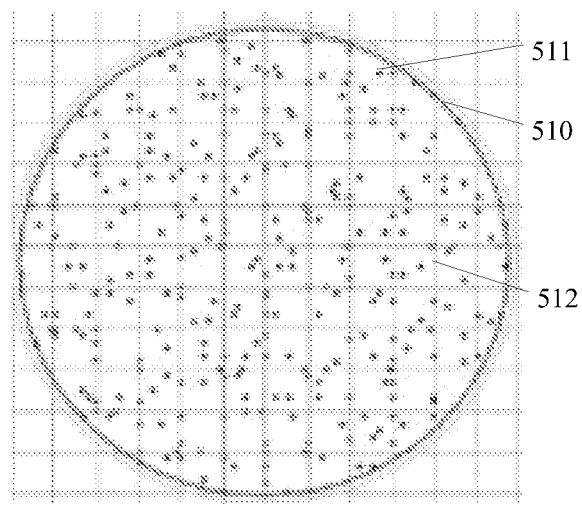

FIG. 18 is a schematic diagram of first inspection distribution maps according to various embodiments of the present disclosure. Referring to FIG. 18, x first inspection distribution maps 510 are obtained. Each first inspection distribution map 510 includes a plurality of inspection sites 512. Each inspection site 512 includes at least one inspection position 511. Inspection positions 511 in the x first inspection distribution maps 510 are not repeated with each other, and x is a natural number greater than or equal to 2.

FIG. 18 schematically shows a schematic diagram of one first inspection distribution map 510, and, for ease of understanding, the inspection positions 511 are represented by dots.

The plurality of inspection sites 512 of the first inspection distribution maps 510 correspond to the shots in a one-to-one correspondence.

In one embodiment, the inspection positions 511 of each first inspection distribution map 510 are obtained from the inspection position information database.

In one embodiment, since the inspection position information database is the dense map 500, obtaining the inspection positions 511 of each first inspection distribution map 510 from the inspection position information database means that each inspection position 511 corresponds to one inspection position 501 in the dense map 500. Moreover, since the plurality of inspection sites 512 of the first inspection distribution maps 510 correspond to the shots, the plurality of inspection sites 512 of each first inspection distribution map 510 correspond to the plurality of inspection sites of the dense map 500 in a one-to-one correspondence.

In one embodiment, a sum of numbers of the inspection positions 511 of the x first inspection distribution maps 510 is the same as a total number of the inspection positions 501 in the inspection position information database, that is, all the inspection positions 511 of the x first inspection distribution maps 510 correspond respectively to all the inspection positions 501 of the dense map 500 in a one-to-one correspondence.

Since the sum of the numbers of the inspection positions 511 of the x first inspection distribution maps 510 is the same as the total number of the inspection positions 501 in the inspection position information database, by performing inspections on the x n-th wafers to be inspected according to the x first inspection distribution maps 510, actual measurement of the overlay accuracy can be performed at least once on positions of the n-th wafers to be inspected corresponding to all inspectable inspection positions 501, thereby further improving the accuracy of the n-th high-order overlay deviation model.

In other embodiments, the sum of the numbers of the inspection positions of the x first inspection distribution maps is less than the total number of the inspection positions in the inspection position information database, that is, not all inspection positions have at least once actual measurement of the overlay accuracy. Therefore, an actual measurement time of the n-th wafers to be inspected and the (n+1)-th wafers to be inspected is reduced. An amount of fitting computation and time to obtain the n-th high-order overlay deviation model and the (n+1)-th high-order overlay deviation model is reduced, thereby improving the efficiency of the overlay deviation compensation process.

In one embodiment, since the sum of the numbers of the inspection positions 511 of the x first inspection distribution maps 510 is the same as the total number of the inspection positions 501 in the inspection position information database, the number x of the first inspection distribution maps 510 depends on the number of the inspection positions 501 of the dense map 500 and a number of the inspection positions 511 of each first inspection distribution map 510. In other embodiments, the number of the first inspection distribution maps can also be preset according to actual demand for the overlay deviation compensation.

In one embodiment, in the x first inspection distribution maps 510, a difference between the numbers of the inspection positions 511 of different first inspection distribution maps 510 is within 15.

Since the difference between the numbers of the inspection positions in different first inspection distribution maps 510 is within 15, the number of the inspection positions 511 in each first inspection distribution map 510 is more uniform, which reduces an inspection process deviation between the n-th wafers to be inspected and between the (n+1)-th wafers to be inspected, which is beneficial to better improve the accuracy of the n-th high-order overlay deviation model and the (n+1)-th high-order overlay deviation model. In addition, a deviation between the time for inspecting each n-th wafer to be inspected and the time for inspecting each (n+1)-th wafer to be inspected can be reduced, which is beneficial to the management and control of the overlay deviation compensation process during the production process.

Alternatively, it is best when the difference is within two.

The number of the inspection positions 511 in each first inspection distribution map 510 is less than or equal to 600, thus the time for inspecting the overlay accuracy of each n-th wafer to be inspected and each (n+1)-th wafer to be inspected is reduced, which is conducive to improving the efficiency for inspecting the overlay accuracy of each n-th wafer to be inspected and each (n+1)-th wafer to be inspected.

Alternatively, when the number of the inspection positions 511 in each first inspection distribution map 510 is less than 300, the inspection accuracy and the inspection efficiency can be better balanced.

In one embodiment, the method for obtaining the x first inspection distribution maps 510 further includes: providing an edge-to-center ratio factor; and obtaining the x first inspection distribution maps 510 according to the edge-to-center ratio factor, such that a distribution of the plurality of inspection positions 511 of each first inspection distribution map 510 on the entire first inspection distribution map 510 conforms to the edge-to-center ratio factor.

The edge-to-center ratio factor refers to a ratio of the number of the inspection positions 511 distributed in the inspection sites 512 corresponding to the shots near a center of a wafer, to the number of the inspection position 511 distributed in the inspection sites 512 corresponding to the shots near an edge of the wafer.

The x first inspection distribution maps 510 are obtained according to the edge-to-center ratio factor, and the distribution of the plurality of inspection positions 511 of each first inspection distribution map 510 on the entire first inspection distribution map 510 conforms to the edge-to-center ratio factor. Therefore, in different current layers, it is possible to increase the inspection positions 511 of the inspection sites 512 corresponding to areas that are prone to defects, etc., which reduce the overlay accuracy, so that in a process of obtaining the n-th high-order overlay deviation model, it is possible to increase a number of positions for actual inspections of the overlay accuracy for the areas that are prone to detects, and add more reference samples for ranges of the overlay accuracy that may have sudden changes, so as to further improve the accuracy of the n-th high-order overlay deviation model and the (n+1)-th high-order overlay deviation model.

Figure 19:
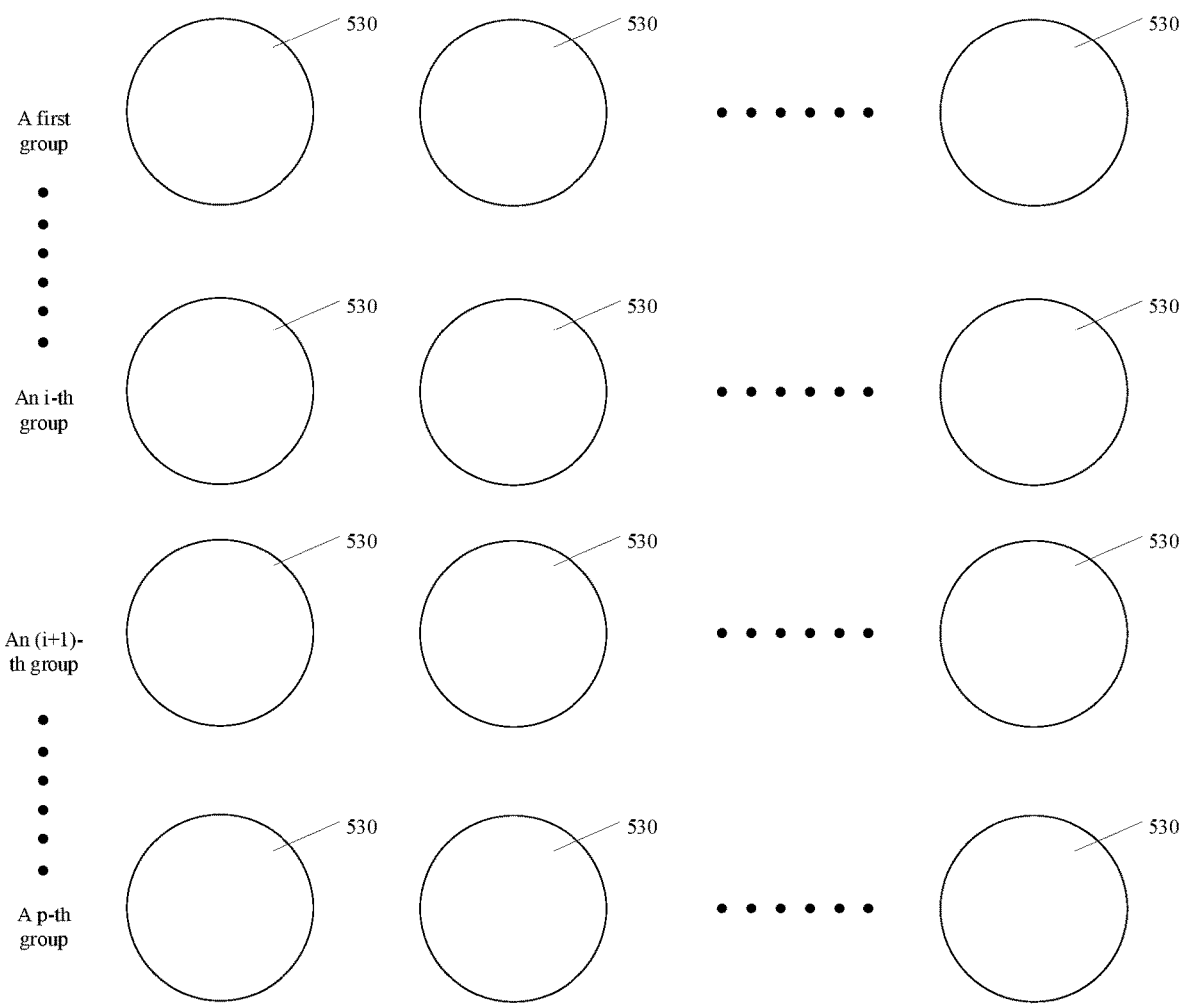
Figure 20:
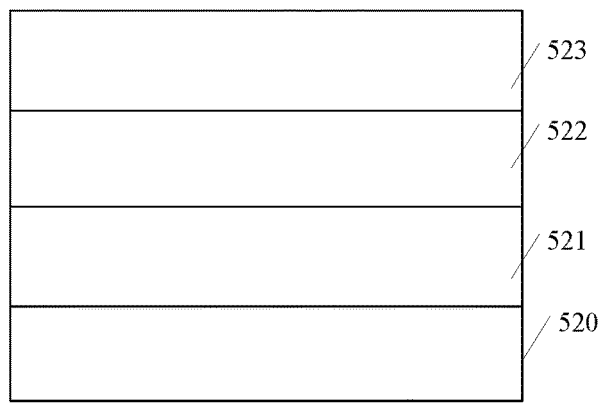
Figure 21:
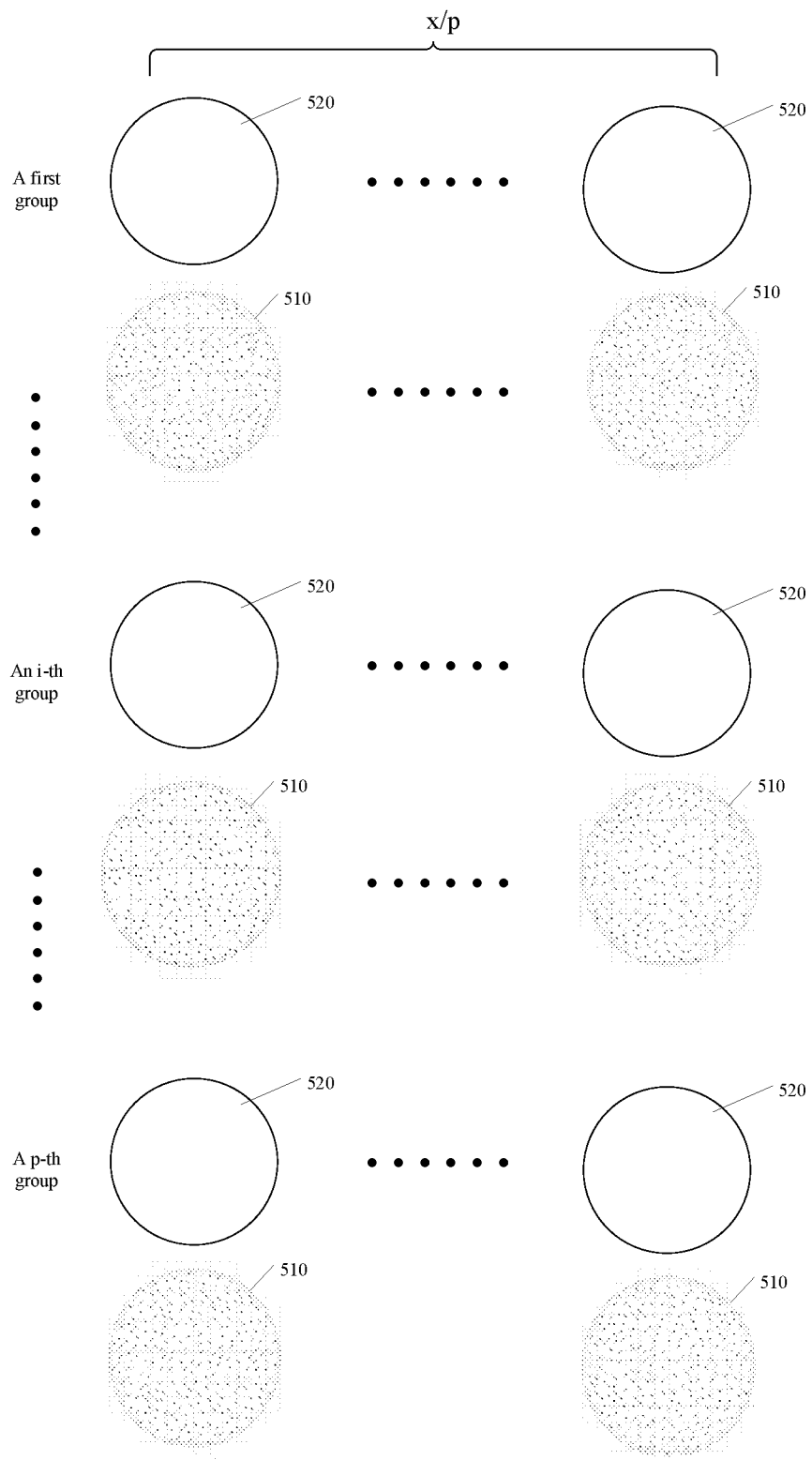

Next, a first iteration is performed on wafers of an n-th lot according to the x first inspection distribution maps 510 to obtain the n-th high-order overlay deviation model. The wafers of the n-th lot include p groups of wafers. Each group of the p groups of wafers includes a plurality of n-th wafers, where n is a natural number greater than or equal to 1, and p is a natural number greater than or equal to 2. FIG. 19 to FIG. 21 can be referred to for an alternative process of the first iteration.

FIG. 19 is a schematic diagram of grouping of wafers of an n-th lot according to various embodiments of the present disclosure, FIG. 20 is a schematic cross-sectional structure diagram of n-th wafers to be inspected according to various embodiments of the present disclosure, and FIG. 21 is a schematic diagram of grouping of n-th wafers to be inspected according to various embodiments of the present disclosure. Referring to FIGS. 19 to 21, the x first inspection distribution maps 510 are allocated, and each n-th wafer to be inspected 520 corresponds respectively to one first inspection distribution map 510. An n-th overlay accuracy information of each n-th wafer to be inspected 520 is obtained according to the corresponding first inspection distribution map 510. The n-th high-order overlay deviation model is obtained according to the x n-th overlay accuracy information.

Since the first iteration is performed on the wafers of the n-th lot according to the x first inspection distribution maps 510 in which the inspection positions 511 are not repeated with each other, it is possible to obtain the n-th higher-order overlay deviation model with higher accuracy. At a same time, the efficiency of the first iteration is higher. The reasons are the same as that described in the embodiment shown in FIG. 5 to FIG. 13, and will not be repeated here.

In one embodiment, the wafers of the n-th lot includes the p-groups of wafers, each group of the p-groups of wafers includes a plurality of n-th wafers 530, and both n and p are a natural number greater than or equal to 2.

In one embodiment, the n-th wafers to be inspected 520 include: a previous layer 521, a current layer 522 to be etched on a surface of the previous layer 521, and a patterning layer 523 on a surface of the current layer 522 to be etched.

In one embodiment, a method for obtaining x n-th wafers to be inspected includes: obtaining two or more n-th wafers to be inspected 520 from the plurality of n-th wafers 530 of each group of the p groups of wafers.

Since from each group of the p groups of wafers in the wafers of the n-th lot, two or more n-th wafers to be inspected 520 are obtained, a number of the n-th wafers 520 to be inspected in each group of the p groups of wafers in the wafers of the n-th lot is less than x.

The wafers of the n-th lot include the p groups of wafers, where p is a natural number greater than or equal to 2. Each group of the p groups of wafers includes a plurality of n-th wafers 530. The method for obtaining the x n-th wafers 520 to be inspected from the plurality of n-th wafers 530 includes: obtaining two or more n-th wafers 520 to be inspected from the plurality of n-th wafers 530 of each group. Therefore, on a basis of inspecting all x first inspection distribution maps 510, the inspection time of each group of wafers can be further reduced, and the efficiency of the overlay deviation compensation can be better improved.

In one embodiment, the method for obtaining the x n-th wafers to be inspected 520 from the wafers of the n-th lot further includes: obtaining a same number of the n-th wafers to be inspected 520 from the plurality of n-th wafers 530 of each group. Therefore, the number of the n-th wafers to be inspected 520 obtained in each group of the wafers of the n-th lot is x/p (as shown in FIG. 21).

In other embodiments, in the wafers of each group of the p groups of wafers in the n-th lot, when two or more n-th wafers to be inspected are obtained, numbers of the n-th wafers to be inspected obtained between the groups are partially the same or are all different.

In one embodiment, obtaining two or more n-th wafers 520 to be inspected from the plurality of n-th wafers 530 of each group of the p groups of wafers refers to using two or more n-th wafers 530 from the wafers of each group of the p groups of wafers in the n-th lot as the n-th wafers to be inspected 520.

Correspondingly, the n-th wafers 530 include: a previous layer 521, a current layer 522 to be etched on a surface of the previous layer 521, and a patterning layer 523 on a surface of the current layer 522 to be etched.

In one embodiment, a method for obtaining the wafers of the n-th lot includes: obtaining an i-th group high-order overlay deviation model of an i-th group, where i is any natural number from 1 to p−1; and according to at least a portion of from a first group high-order overlay deviation model through the i-th group high-order overlay deviation model obtained from historical processing, performing the overlay deviation compensation on an (i+1)-th group.

The first group high-order overlay deviation model through the i-th group high-order overlay deviation model are for the wafers of the n-th lot. Similarly, for wafers of a first lot through wafers of an (n−1)-th lot, a group high-order overlay deviation model corresponding to wafers of each group of wafers of each lot can be obtained.

In the wafers of the n-th lot, wafers of a first group through wafers of the i-th group will obtain corresponding the first group high-order overlay deviation model through the i-th group high-order overlay deviation model, therefore, when processing wafers of an (i+1)-th group, at least a portion of from the first group high-order overlay deviation model through the i-th group high-order overlay deviation model obtained from historical processing will be used as a basis, to perform the compensation on the wafers of the (i+1)-th group.

Alternatively, in one embodiment, before obtaining the n-th overlay accuracy information of each n-th wafer 520 to be inspected according to the corresponding first inspection distribution map 510, it is necessary to obtain other wafers in a same group of the n-th wafer 520 to be inspected. After obtaining the other wafers in the same group of the n-th wafer to be inspected 520, the n-th overlay accuracy information of each n-th wafer 520 to be inspected is obtained according to the n-th wafer to be inspected 520. After obtaining x n-th overlay accuracy information of the x n-th wafer 520 to be inspected, the n-th high-order overlay deviation model is obtained according to the x n-th overlay accuracy information.

A method of obtaining the n-th high-order overlay deviation model according to the x n-th overlay accuracy information is the same as the method of obtaining the n-th high-order overlay deviation model in the embodiment shown in FIG. 5 to FIG. 13, and will not be repeated here.

In one embodiment, a method for obtaining the i-th group high-order overlay deviation model includes: fitting two or more n-th overlay accuracy information of the i-th group to obtain the i-th group high-order overlay deviation model.

By taking n=3 and i=2 as an example, a second group of wafers of a third lot is taken as an example. Before obtaining a third overlay accuracy information of third wafers to be inspected 520 in the second group, the second group of the wafers of the third lot is obtained. After obtaining third wafers 530 in the second group, two or more third wafers 530 of the second group are used as the third wafers to be inspected 520. According to each third wafer to be inspected 520 in the second group, the third overlay accuracy information of each third wafer to be inspected 520 in the second group is obtained. Two or more third overlay accuracy information in the second group are fitted, to obtain a second group high-order overlay deviation model of the wafers of the third lot.

Alternatively, each inspection position 511 and a corresponding inspection result (overlay accuracy) are used as one sample data. All the inspection positions 511 of two or more first inspection distribution maps 510 in the second group are spliced. All the inspection positions 511 of the two or more first inspection distribution maps 510 in the second group and the inspection results corresponding to respective inspection positions 511 are used as sample data to obtain the second group high-order overlay deviation model.

In a process of obtaining the wafers of the (i+1)-th group, the overlay deviation compensation is performed on the wafers of the (i+1)-th group. Therefore, the overlay accuracy of the wafers of the (i+1)-th group is improved. At a same time, according to n-th wafers to be inspected in the (i+1)-th group, an overlay accuracy information with higher accuracy can be obtained, so as to better improve the accuracy of the n-th high-order overlay deviation model. On top of reducing the inspection time of the wafers of each group, not only the overlay accuracy of the wafers of the (n+1)-th lot is better improved, but also the overlay accuracy of each group of the wafers of the n-th lot is improved.

In one embodiment, the method for obtaining the wafers of the n-th lot further includes: when n is greater than 1, according to at least a portion of from the first high-order overlay deviation model through an (n−1)-th high-order overlay deviation model obtained from historical processing, performing the overlay deviation compensation on the (i+1)-th group. Therefore, not only the first group through the i-th group of the wafers of the n-th lot are used as a reference basis for the compensation, but also the wafers of the first lot through the wafers of the (n−1)-th lot are also used as a reference basis for the compensation, thereby improving overall stability and accuracy of a compensation parameter for adjusting process parameters for forming the patterning layer 523 of the n-th wafers of the (i+1)-th group.

Since the wafers of the first lot through the wafers of the (n−1)-th lot will all perform S510, the first high-order overlay deviation model through the (n−1)-th high-order overlay deviation model will be obtained. When obtaining the wafers of the n-th lot, at least a portion of from the first high-order overlay deviation model through the (n−1)-th high-order overlay deviation model obtained from historical processing will be used as a basis, to perform the compensation on the wafers of the n-th lot.

Taking the (n−1)-th high-order overlay deviation model as an example, a method of obtaining the (n−1)-th high-order overlay deviation model includes: after obtaining x (n−1)-th overlay accuracy information of the wafers of the (n−1)-th lot, obtaining the (n−1)-th high-order overlay deviation model according to the x (n−1)-th overlay accuracy information. Alternatively, the method for obtaining the (n−1)-th high-order overlay deviation model according to the x (n−1)-th overlay accuracy information is the same as the method for obtaining the n-th high-order overlay deviation model in the embodiment shown in FIG. 5 to FIG. 13, and will not be repeated here.

Alternatively, in one embodiment, a method for obtaining the first group of the wafers of the n-th lot includes: when n>1, according to a first high-order overlay deviation model $M_1$ through an (n−1)-th high-order overlay deviation model $M_{n-1}$, obtaining a compensation parameter $P_n$ to adjust process parameters for forming the patterning layer 523 of the first group to form the patterning layer 523 of the n-th wafers of the first group. An alternative method for obtaining the compensation parameter $P_n$ is the same as the method for obtaining the compensation parameter $P_{n+1}$ in the embodiment shown in FIG. 5 to FIG. 13, and will not be repeated here.

In one embodiment, the first group of the wafers of the first lot is directly provided. In other embodiments, an empirical compensation parameter is provided, and process parameters of the first group of the wafers of the first lot are adjusted according to the empirical compensation parameter to form the first group of the wafers of the first lot.

A method of obtaining the (i+1)-th group of the wafers of the n-th lot includes: when n=1, obtaining a compensation parameter $S_{i+1}$ according to a first group high-order overlay deviation model $B_1$ through an i-th group high-order overlay deviation model $B_i$; and according to the compensation parameter $S_{i+1}$, adjusting process parameters for forming the patterning layer 523 of the n-th wafers of the (i+1)-th group to form the patterning layer 523 of the wafers of the (i+1)-th group.

The method for obtaining the (i+1)-th group of the wafers of the n-th lot further includes: when n>1, obtaining a compensation parameter Ln according to the first high-order overlay deviation model $M_1$ through the (n−1)-th high-order overlay deviation model $M_{n-1}$; obtaining the compensation parameter $S_{i+1}$ according to the first group high-order overlay deviation model $B_1$ through the i-th group high-order overlay deviation model $B_i$; and at a same time, according to the compensation parameter Ln and the compensation parameter $S_{i+1}$, adjusting the process parameters for forming the patterning layer 523 of the n-th wafers of the (i+1)-th group to form the patterning layer 523 of the wafers of the (i+1)-th group.

The compensation parameter Ln is a parameter that function as a calibration for the compensation parameter $S_{i+1}$.

In particular, $$L_n = \sum_{1}^{n-1} \mu_{n-1} D_{n-1},$$

where, $D_{n-1}$ is a calibration parameter obtained based on the wafers of the (n−1)-th lot, and $\mu_{n-1}$ is a weight coefficient of the calibration parameter $D_{n-1}$, that is, a calibration parameter obtained based on wafers of a lot corresponds to its respective weight coefficient μ. For example, $\mu_1$ is the weight coefficient of the calibration parameter $D_1$ obtained based on the wafers of the first lot, $\mu_2$ is the weight coefficient of the calibration parameter $D_2$ obtained based on the wafers of the second lot, and so on.

In one embodiment, a method for obtaining the calibration parameter $D_{n-1}$ includes: obtaining the calibration parameter $D_{n-1}$ according to the (n−1)-th high-order overlay deviation model $M_{n-1}$ obtained from the wafers of the (n−1)-th lot, and at least one of the group high-order overlay deviation model B of each group of the wafers of the (n−1)-th lot.

Alternatively, the method for obtaining the calibration parameter $D_{n-1}$ includes: obtaining a parameter corresponding to the (n−1)-th high-order overlay deviation model $M_{n-1}$ according to the (n−1)-th high-order overlay deviation model $M_{n-1}$; obtaining a group parameter corresponding to the group high-order overlay deviation model B of each group of the wafers of the (n−1)-th lot; according to all the group parameters of the wafers of the (n−1)-th lot, obtaining an average group parameter corresponding to the wafers of the (n−1)-th lot; and obtaining a difference between the parameter corresponding to the (n−1)-th high-order overlay deviation model $M_{n-1}$ and the average group parameter corresponding to the wafers of the (n−1)-th lot. The calibration parameter $D_{n-1}$ is the difference.

In other embodiments, a difference between the parameter corresponding to the (n−1)-th high-order overlay deviation model $M_{n-1}$ and a group parameter corresponding to the group high-order overlay deviation model B of any group of the wafers of the (n−1)-th lot can be used as the calibration parameter $D_{n-1}$ obtained from the wafers of the (n−1)-th lot.

In other embodiments, the average group parameter corresponding to the wafers of the (n−1)-th lot may also be obtained according to a plurality of group parameters of the wafers of the (n−1)-th lot.

In one embodiment, $$S_{i+1} = \sum_{1}^{i} \gamma_i B_i,$$

where, $\gamma_i$ is a weight coefficient of the i-th group high-order overlay deviation model $B_i$, that is, the group high-order overlay deviation model B of each group corresponds to its respective weight coefficient γ. For example, $\gamma_1$ is the weight coefficient of the first group high-order overlay deviation model $B_1$, $\gamma_2$ is the weight coefficient of the second group high-order overlay deviation model $B_2$, and so on.

Therefore, it is possible to adjust a participation degree of the calibration parameter D of each lot when obtaining the compensation parameter L according to actual conditions of all the wafers of each lot such as wafer pattern accuracy, defects, inspection process, etc. It is possible to adjust a participation degree of each group high-order overlay deviation model B when obtaining the compensation parameter S according to the actual conditions of all the wafers of each lot such as wafer pattern accuracy, defects, inspection process, etc. Therefore, the flexibility of the overlay deviation compensation is improved, and the accuracy of the overlay deviation compensation is further improved.

Both the weight coefficient μ and the weight coefficient 7 can be zero, that is, according to actual situation, some or all of from the calibration parameter $D_1$ obtained according to the first higher-order overlay deviation model $M_1$ through the calibration parameter $D_{n-1}$ obtained according to the (n−1)-th higher-order overlay deviation model $M_{n-1}$ are used as a basis for obtaining the compensation parameter Ln. At a same time, some or all of from the first group high-order overlay deviation model $B_1$ through the i-th group high-order overlay deviation model $B_i$ can be used as a basis for obtaining the compensation parameter $S_{i+1}$.

In one embodiment, $\lambda_{n-1}=f(n-1,\Delta T_{n-1})$, where, $\Delta T_{n-1}=T_n-T_{n-1}$, and T is a time when a compensation is performed on wafers of each lot. The time is, for example, a start time or an end time when the compensation is performed on a last group of the wafers of each lot, etc.

In one embodiment, $\gamma_i=f(i,\Delta t_i)$, where $\Delta t_i=t_{i+1}-t_i$, and t is a time when a compensation is performed on each group of the wafers of each lot. The time is, for example, a start time or an end time when the compensation is performed on wafers of a first group.

Alternatively, taking n=3 and i=1 as an example, the method of obtaining the (i+1)-th group of the wafers of the n-th lot will be described, that is, the method for obtaining the second group of the wafers of the third lot will be explained.

The method of obtaining the second group of the wafers of the third lot includes: obtaining a compensation parameter $L_3$, that the compensation parameter $L_3=\mu_1 D_1+\mu_2 D_2$; obtaining a compensation parameter $S_2$, that $S_2=\gamma_1 B_1$; and at a same time according to the compensation parameter $L_3$ and the compensation parameter $S_2$, adjusting process parameters for forming the patterning layer 523 of the third wafers of the second group to form the patterning layer 523 of the third wafers of the second group.

A calibration parameter $D_1$ is obtained according to the wafers of the first lot, and a calibration parameter $D_2$ is obtained according to the wafers of the second lot.

Alternatively, a method of obtaining the calibration parameter $D_1$ according to the wafers of the first lot includes: obtaining a parameter corresponding to the first high-order overlay deviation model $M_1$; according to the group high-order overlay deviation model B of each group of the wafers of the first lot, respectively obtaining a group parameter corresponding to the group high-order overlay deviation model B of each group of the wafers of the first lot, for example, obtaining a first group parameter according to the first group high-order overlay deviation model $B_1$, and obtaining a second group parameter according to the second group high-order overlay deviation model $B_2$; according to all the group parameters of the wafers of the first lot, obtaining an average group parameter corresponding to the wafers of the first lot; and using a difference between the parameter corresponding to the first high-order overlay deviation model $M_1$ and the average group parameter corresponding to the wafers of the first lot as the calibration parameter $D_1$.

Similarly, a difference between a parameter corresponding to the second high-order overlay deviation model $M_2$ and an average group parameter corresponding to the wafers of the second lot is used as the calibration parameter $D_2$. An alternative process is the same as the process for obtaining the calibration parameter $D_1$ and will not be repeated here.

Figure 22:
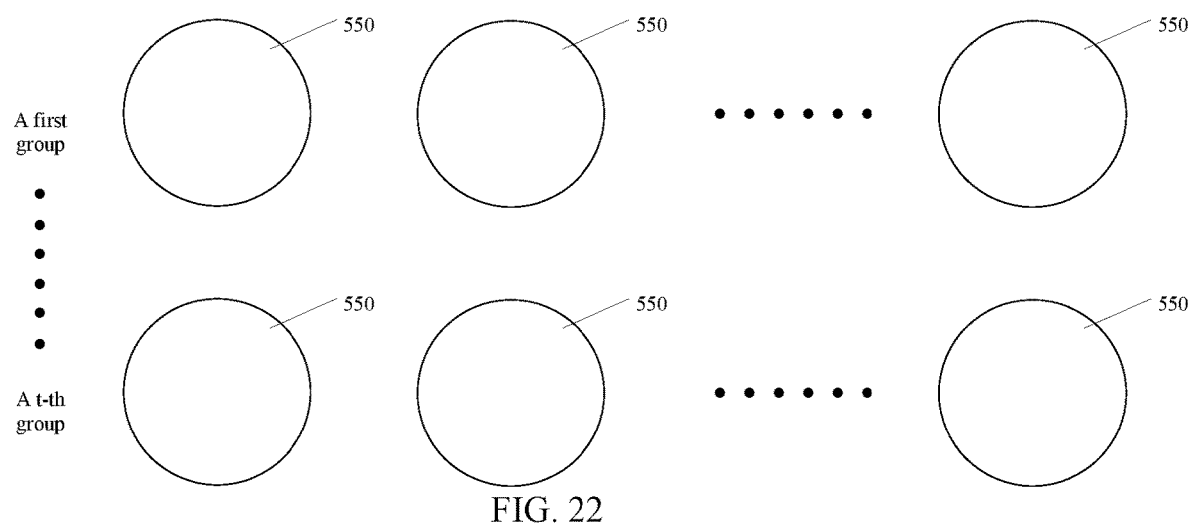

FIG. 22 is a schematic diagram of grouping of wafers of an (n+1)-th lot in various embodiments of the present disclosure. Referring to FIG. 22, wafers of an (n+1)-th lot are obtained. According to the x first inspection distribution maps 510, the first iteration is performed on the wafers of the (n+1)-th lot to obtain an (n+1)-th high-order overlay deviation model.

The wafers of the (n+1)-th lot include t groups of wafers, where t is a natural number greater than or equal to 2, and each group of the t groups of wafers includes a plurality of (n+1)-th wafers 550.

Alternatively, a method of performing the first iteration on the wafers of the (n+1)-th lot according to the x first inspection distribution maps 510 is the same as the method of performing the first iteration on the wafers of the n-th lot according to the x first inspection distribution maps 510, and will not be repeated here. Therefore, correspondingly, in one embodiment, a method of obtaining x (n+1)-th wafers to be inspected from the wafers of the (n+1)-th lot is the same as the method of obtaining the x n-th wafers to be inspected from the wafers of the n-th lot, including: obtaining two or more (n+1)-th wafers to be inspected from the plurality of (n+1)-th wafers in each group, and will not be repeated here.

In one embodiment, a method for obtaining the wafers of the (n+1)-th lot, that is, obtaining the (n+1)-th wafers 550 of the t groups includes: according to at least a portion of from the first high-order overlay deviation model through the n-th high-order overlay deviation model obtained from historical processing, performing the overlay deviation compensation on a first group of the t groups of wafers.

In one embodiment, the method for obtaining the wafers of the (n+1)-th lot, that is, obtaining the (n+1)-th wafer 550 of the t groups, further includes: obtaining a k-th group high-order overlay deviation model of a k-th group, where k is any natural number from 2 to t−1; and according to at least a portion of from a first group high-order overlay deviation model through the k-th group high-order overlay deviation model, performing the overlay deviation compensation on a (k+1)-th group.

In one embodiment, the method for obtaining the wafers of the (n+1)-th lot, that is, obtaining the (n+1)-th wafer 550 of the t groups, further includes: after obtaining the k-th group high-order overlay deviation model of the k-th group, according to at least a portion of from the first high-order overlay deviation model through the n-th high-order overlay deviation model obtained from historical processing, performing the overlay deviation compensation on the (k+1)-th group.

An alternative method for obtaining the wafers of the (n+1)-th lot, that is, obtaining the (n+1)-th wafer 550 of the t groups, is the same as the method for obtaining the wafers of the n-th lot, and will not be repeated here.

Although the present disclosure is disclosed as above, the present disclosure is not limited to this. Any person skilled in the art can make various changes and modifications without departing from the spirit and scope of the present disclosure. Therefore, the protection scope of the present disclosure shall be subject to the scope defined by the claims.

What is claimed is:

1. A compensation method for overlay deviation, comprising:
   obtaining x first inspection distribution maps, wherein each first inspection distribution map includes a plurality of inspection sites, each inspection site at least includes one inspection position, the inspection positions in one of the x first inspection distribution maps are different from the inspection positions in another one of the x first inspection distribution maps, x is a natural number greater than or equal to two, a total number of the inspection positions of the x first inspection distribution maps is same as a number of all inspection positions of a full inspection distribution map, an area of each of the x first inspection distribution maps is same as an area of the full inspection distribution map, and obtaining the x first inspection distribution maps includes:
- providing an edge-to-center ratio factor, the edge-to-center ratio factor being a ratio between a number of the inspection positions distributed in the plurality of inspection sites closer to a center of a wafer than an edge of the wafer and a number of the inspection positions distributed in the plurality of inspection sites closer to the edge of the wafer than the center of the wafer; and
- according to the edge-to-center ratio factor, obtaining the x first inspection distribution maps, wherein a distribution of the plurality of inspection positions of each first inspection distribution map on the entire first inspection distribution map conforms to the edge-to-center ratio factor; and performing a first iteration on wafers of an n-th lot according to the x first inspection distribution maps to obtain an n-th high-order overlay deviation model, wherein the wafers of the n-th lot include a plurality of n-th wafers, n is a natural number greater than or equal to one, and performing the first iteration includes:
- obtaining x n-th wafers to be inspected from the wafers of the n-th lot;
- allocating the x first inspection distribution maps, wherein each n-th wafer to be inspected corresponds to one first inspection distribution map;
- obtaining an n-th overlay accuracy information of each n-th wafer to be inspected according to a corresponding first inspection distribution map; and
- obtaining the n-th high-order overlay deviation model according to the x n-th overlay accuracy information.

2. The method according to claim 1, further comprising:
providing wafers of an (n+1)-th lot, and
according to at least a portion of from a first high-order overlay deviation model through the n-th high-order overlay deviation model obtained from historical processing, performing an overlay deviation compensation on the wafers of the (n+1)-th lot.

3. The method according to claim 2, wherein:
the wafers of the (n+1)-th lot include a plurality of (n+1)-th wafers; and
the method further includes: after performing the overlay deviation compensation on the wafers of the (n+1)-th lot, performing the first iteration on the wafers of the (n+1)-th lot according to the x first inspection distribution maps to obtain an (n+1)-th high-order overlay deviation model.

4. The method according to claim 2, wherein:
the wafers of the (n+1)-th lot include a plurality of (n+1)-th wafers; and
the method further includes: obtaining y second inspection distribution maps, wherein each second inspection distribution map includes a plurality of inspection sites, each inspection site at least includes one inspection position, inspection positions in the y second inspection distribution maps are not repeated with each other, and y is a natural number greater than or equal to two; and
after performing the overlay deviation compensation on the wafers of the (n+1)-th lot, performing the first iteration on the wafers of the (n+1)-th lot according to the y second inspection distribution maps to obtain an (n+1)-th high-order overlay deviation model.

5. The method according to claim 1, wherein:
the wafers of the n-th lot include p groups of wafers, p is a natural number greater than or equal to two, each group of the p groups includes a plurality of n-th wafers, and obtaining the x n-th wafers to be inspected from the wafers of the n-th lot includes: obtaining two or more n-th wafers to be inspected from the plurality of n-th wafers of each group.

6. The method according to claim 5, wherein:
obtaining the wafers of the n-th lot includes:
- obtaining an i-th group high-order overlay deviation model of an i-th group, wherein i is any natural number from one to p−1; and
- according to at least a portion of from a first group high-order overlay deviation model through the i-th group high-order overlay deviation model obtained from historical processing, performing an overlay deviation compensation on an (i+1)-th group.

7. The method according to claim 6, wherein:
obtaining the wafers of the n-th lot further includes:
- when n is greater than one, further according to at least a portion of from a first high-order overlay deviation model through an (n−1)-th high-order overlay deviation model obtained from historical processing, performing the overlay deviation compensation on the (i+1)-th group.

8. The method according to claim 6, wherein:
obtaining the i-th group high-order overlay deviation model includes:
- fitting two or more n-th overlay accuracy information of the i-th group, to obtain the i-th group high-order overlay deviation model.

9. The method according to claim 7, further comprising:
obtaining wafers of an (n+1)-th lot, and performing the first iteration on the wafers of the (n+1)-th lot according to the x first inspection distribution maps, to obtain an (n+1)-th high-order overlay deviation model.

10. The method according to claim 9, wherein:
the wafers of the (n+1)-th lot include t groups of wafers, t is a natural number greater than or equal to two, each group of the t groups of wafers includes a plurality of (n−1)-th wafers, and
obtaining x (n+1)-th wafers to be inspected from the wafers of the (n+1)-th lot includes:
- obtaining two or more (n+1)-th wafers to be inspected from the plurality of (n+1)-th wafers of each group.

11. The method according to claim 10, wherein:
obtaining the wafers of the (n+1)-th lot includes:
- according to at least a portion of from the first high-order overlay deviation model through the n-th high-order overlay deviation model obtained from historical processing, performing the overlay deviation compensation on a first group of the t groups of wafers.

12. The method according to claim 11, wherein:
obtaining the wafers of the (n+1)-th lot further includes:
- obtaining a k-th group high-order overlay deviation model of a k-th group, wherein k is any natural number from two to t−1; and
- according to at least a portion of from a first group high-order overlay deviation model through the k-th group high-order overlay deviation model, performing the overlay deviation compensation on a (k+1)-th group.

13. The method according to claim 12, wherein:
obtaining the wafers of the (n+1)-th lot further includes:
    after obtaining the k-th group high-order overlay deviation model, further according to at least a portion of from the first high-order overlay deviation model through the n-th high-order overlay deviation model obtained from historical processing, performing the overlay deviation compensation on the (k+1)-th group; and/or
obtaining the k-th group high-order overlay deviation model includes: fitting two or more (n+1)-th overlay accuracy information of the k-th group, to obtain the k-th group high-order overlay deviation model.

14. The method according to claim 5, wherein:
obtaining the x n-th wafers to be inspected from the wafers of the n-th lot further includes:
    obtaining a same number of n-th wafers to be inspected from the plurality of n-th wafers of each group.

15. The method according to claim 1, wherein:
obtaining the n-th high-order overlay deviation model according to the x n-th overlay accuracy information includes: fitting the x n-th overlay accuracy information, to obtain the n-th high-order overlay deviation model.

16. The method according to claim 4, wherein:
obtaining the y second inspection distribution maps further includes:
    according to the edge-to-center ratio factor, obtaining the y second inspection distribution maps, wherein a distribution of the plurality of inspection positions of each second inspection distribution map on the entire second inspection distribution map conforms to the edge-to-center ratio factor.

17. The method according to claim 1, wherein:
obtaining the x first inspection distribution maps further includes:
    providing an inspection position information database, wherein the inspection position information database includes a plurality of inspection positions that are not repeated with each other; and
    obtaining the inspection positions of each first inspection distribution map from the inspection position information database.

18. The method according to claim 17, wherein:
the total number of the inspection positions of the x first inspection distribution maps is same as a total number of the inspection positions in the inspection position information database.

19. The method according to claim 4, wherein:
obtaining the y second inspection distribution maps further includes:
    providing an inspection position information database, wherein the inspection position information database includes a plurality of inspection positions that are not repeated with each other, and
    obtaining the inspection positions of each second inspection distribution map from the inspection position information database.

20. The method according to claim 1, wherein:
a difference between numbers of the inspection positions of different first inspection distribution maps in the x first inspection distribution maps is within 15; and/or
a number of the inspection positions of each first inspection distribution map is less than or equal to 600.

* * * * *